US009608428B2

(12) United States Patent
Petruzzi et al.

(10) Patent No.: US 9,608,428 B2
(45) Date of Patent: Mar. 28, 2017

(54) DISTINGUISHING BETWEEN OVERLOAD AND OPEN LOAD IN OFF CONDITIONS

(71) Applicant: Infineon Technologies Austria AG, Villach (AT)

(72) Inventors: Luca Petruzzi, Gödersdorf (AT); Stephane Fraisse, Munich (DE); Robert Illing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 151 days.

(21) Appl. No.: 14/159,177

(22) Filed: Jan. 20, 2014

(65) Prior Publication Data

US 2015/0207306 A1 Jul. 23, 2015

(51) Int. Cl.
*H01H 73/00* (2006.01)
*H02H 1/00* (2006.01)
*G01R 19/165* (2006.01)
*G01R 31/327* (2006.01)
*H02H 3/04* (2006.01)
*H03K 17/18* (2006.01)

(52) U.S. Cl.
CPC ......... *H02H 1/0061* (2013.01); *G01R 19/165* (2013.01); *G01R 31/327* (2013.01); *H02H 3/04* (2013.01); *H03K 17/18* (2013.01)

(58) Field of Classification Search
CPC ...... H02H 1/0061; H02H 3/04; G01R 19/165; G01R 31/327; H03K 17/18
USPC .......................................... 361/115
See application file for complete search history.

(56) References Cited

U.S. PATENT DOCUMENTS

| 5,153,809 | A | | 10/1992 | Murakami | |
|---|---|---|---|---|---|
| 5,920,452 | A | * | 7/1999 | Sullivan | H02H 3/087 361/101 |
| 6,373,671 | B1 | * | 4/2002 | Watanabe | H03K 17/0822 361/103 |
| 7,154,240 | B2 | * | 12/2006 | Watanabe | H02P 29/028 318/432 |
| 7,701,686 | B2 | | 4/2010 | Kato et al. | |

FOREIGN PATENT DOCUMENTS

| DE | 4035571 A1 | 5/1991 |
|---|---|---|
| DE | 112005002954 T5 | 10/2007 |

OTHER PUBLICATIONS

"PROFET™+ 24V BTT6020-1EKA Smart High-Side Power Switch Single Channel, 20mΩ" Infineon, Data Sheet Rev. 1.0, Aug. 7, 2013. 54 pp.
Office Action, in the German language, from counterpart German Application No. 102015100796.7, dated Nov. 17, 2016, 7 pp.

* cited by examiner

*Primary Examiner* — Thienvu Tran
*Assistant Examiner* — Lucy Thomas
(74) *Attorney, Agent, or Firm* — Shumaker & Sieffert, P.A.

(57) ABSTRACT

Techniques are described for determining whether a switch circuit experienced one of a latched overload condition and an open load with no input voltage condition. In the techniques, a first diagnostic signal is output if the switch circuit experienced the latched overload condition. Also, in the techniques, a second, different diagnostic signal is output if the switch circuit experienced the open load with no input voltage condition.

15 Claims, 13 Drawing Sheets

DISTINGUISHING BETWEEN OVERLOAD AND OPEN LOAD IN OFF CONDITIONS

TECHNICAL FIELD

This disclosure is related to switches, and more particularly, to an overload condition and an open load in off condition in the switches.

BACKGROUND

Switches are generally used to drive various types of loads. In some examples, the switches reside with a switch circuit which may be formed as an integrated circuit (IC) chip. The switch circuit may also be designed to provide overload protection to limit the amount of current that flows through the switches, such as for short circuit protection, over temperature protection, and current sensing and diagnosis capabilities.

Additionally, the switch circuit may output diagnostic signals. For example, in response to a signal to enable diagnostics, the switch circuit may output a signal (e.g., a current or a voltage) indicative of whether the switch circuit experienced a latched overload condition. In some examples, the switch circuit may also output a signal indicative of whether the switch circuit experienced an open load in off condition.

SUMMARY

In general, the disclosure describes techniques to distinguish between a first situation when a switch circuit is indicating a latched overload condition and a second situation when the switch circuit is indicating an open load with no input voltage condition. The second situation may also be referred to as an open load in off condition. The latched overload condition may be part of a protection mechanism whereby the switch circuit stops the flow of current if an overload condition is detected. The current may flow again following the latched overload condition (e.g., after a reset). The open load in off condition may be the condition where there is no input voltage (e.g., no VIN) on the switch circuit and there is no load connected to the switch circuit.

In the techniques described in this disclosure, the switch circuit may output a first diagnostic signal when the switch circuit detects the latched overload condition and a second, different diagnostic signal when the switch circuit detects the open load in off condition. For example, the first, diagnostic signal may be a current that the switch circuit outputs at a first amplitude, and the second diagnostic signal may be current that the switch circuit outputs at a second, different amplitude.

By distinguishing between the latched overload condition and the open load with no input voltage (e.g., open load in off condition), the techniques may allow for resetting the switch circuit, in response to the latched overload condition, without needing an additional pin on the switch circuit. For example, the techniques may allow for a pin of the switch circuit that is used for a particular purpose to also be used for resetting the switch circuit so that an additional, separate reset pin is not required for the switch circuit.

In one example, the disclosure is directed to a method comprising determining whether a switch circuit experienced one of a latched overload condition and an open load with no input voltage condition, in response to determining that the switch circuit experienced the latched overload condition, outputting a first diagnostic signal indicating that the switch circuit experienced the latched overload condition, and in response to determining that the switch circuit experienced the open load with no input voltage condition, outputting a second, different diagnostic signal indicating that the switch circuit experienced the open load with no input voltage condition.

In another example, the disclosure is directed to a switch circuit comprising a diagnostic output pin and a switch controller. The switch controller is configured to determine whether the switch circuit experienced one of a latched overload condition and an open load with no input voltage condition, in response to determining that the switch circuit experienced the latched overload condition, output, via the diagnostic output pin, a first diagnostic signal indicating that the switch circuit experienced the latched overload condition, and in response to determining that the switch circuit experienced the open load with no input voltage condition, output, via the diagnostic output pin, a second, different diagnostic signal indicating that the switch circuit experienced the open load with no input voltage condition.

In another example, the disclosure is directed to a system comprising a micro-controller configured to determine whether a switch circuit experienced a latched overload condition or an open load with no input voltage condition based on whether the micro-controller received a first diagnostic signal from the switch circuit or a second, different diagnostic signal from the switch circuit.

The details of one or more examples described in this disclosure are set forth in the accompanying drawings and the description below. Other features, objects, and advantages of the techniques will be apparent from the description and drawings, and from the claims.

DETAILED DESCRIPTION

Figure 1:
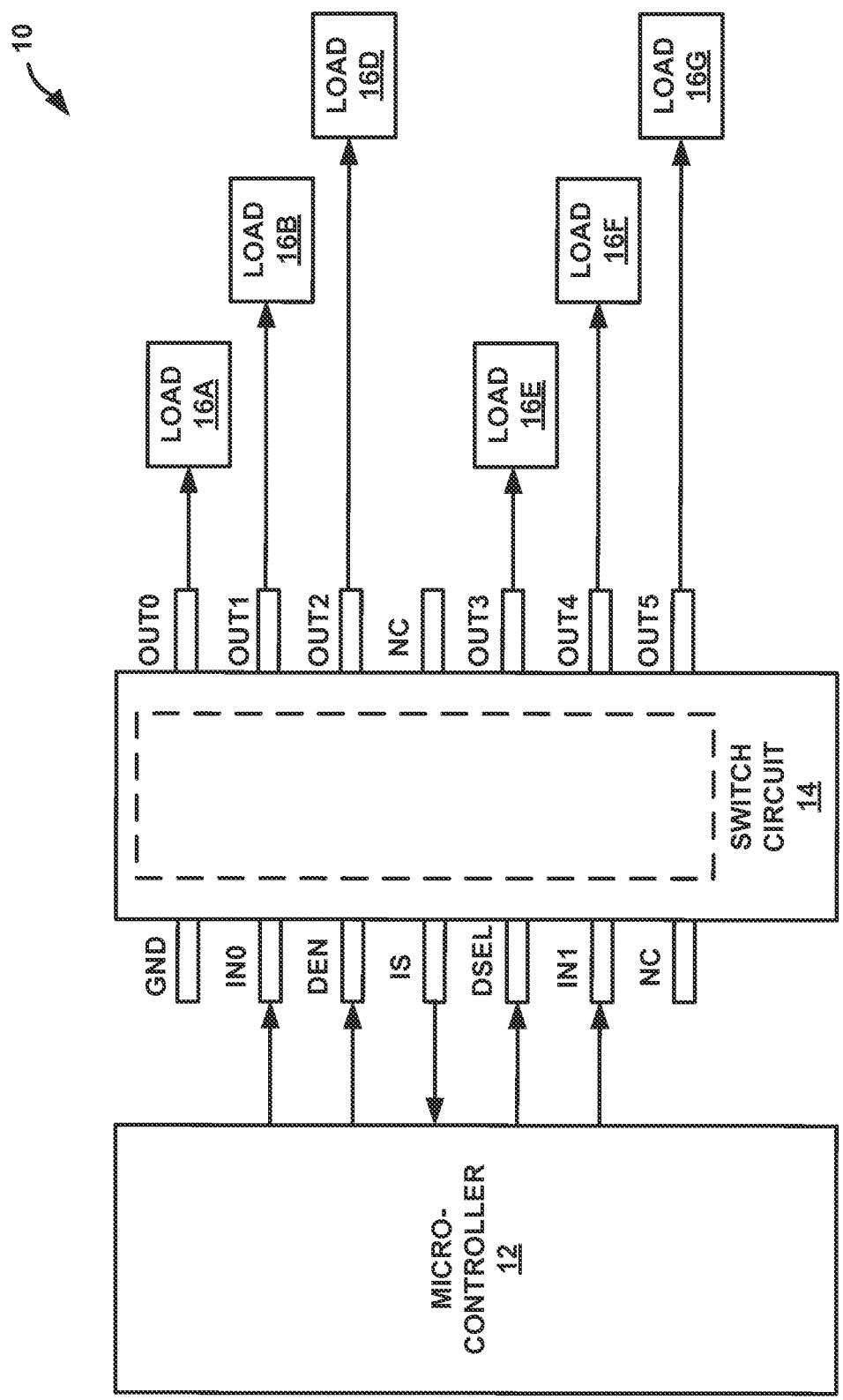
FIG. 1 is a block diagram illustrating an example load driver system.

A switch circuit may be an integrated circuit (IC) chip that includes a plurality of switches and a switch controller. The switch circuit may receive a voltage as an input, and in response, the switch controller may turn on or off one or more of the switches. For example, a micro-controller coupled to the switch circuit may select which switches the switch controller of the switch circuit is to control based on the input voltage. In response to a digital high of the input voltage, the switch controller may turn on the selected switches, and in response to a digital low of the input voltage, the switch controller may turn off the selected switches.

The switch circuit may provide diagnostic capabilities, and the micro-controller may use the diagnostic information for controlling the switch circuit and the overall system. In some cases, the signal indicating that the switch circuit experienced a latched overload condition and the signal indicating that the switch circuit experienced an open load with no input voltage condition, referred to as an open load in off condition may be the same signal, which may result in the micro-controller misdiagnosing the condition experienced by the switch circuit (e.g., the switch circuit cannot distinguish between the latched overload condition and the open load in off condition). In the techniques described in this disclosure, the switch circuit may output different signals for the latched overload condition and the open load in off condition. As described in more detail below, this allows the micro-controller to properly diagnose the condition experienced by the switch controller, as well as allow a diagnostic enable pin of the switch circuit to be better suited for resetting the switch circuit in response to a latched overload condition.

The switches of the switch circuit may be coupled to various types of loads. For instance, for automotive applications the switches of the switch circuit may be coupled to motors, relays, bulbs, LED modules for interior and exterior lighting, and the like. The switch circuit may include a plurality of output pins, with each of the output pins connected to the output of a switch of the switch circuit. The loads that are to be driven by the switch circuit may be coupled to the output pins.

By controlling the input voltage, the micro-controller may be control when current flows through the switches for driving the load. For example, the micro-controller may output a pulse width modulated (PWM) voltage signal as the input voltage signal. By controlling the on-time and frequency of the PWM voltage signal, the micro-controller may control when the switch circuit drives current to the loads.

In addition to controlling the switches of the switch circuit, the switch controller of the switch circuit may provide protection to the switch circuit. Such protection may be important to ensure that voltages, currents, and temperature are within tolerable ranges to avoid damaging the switch circuit or other components.

As one example, the switch controller may protect the switch circuit from overload current. In a short circuit condition, the level of the current that flows through the switches may be greater than desirable. Such high level of current may damage the switches, other components within the switch circuit, or components external to the switch circuit. To protect from overload current, the switch controller may be configured to turn off switches if the current flowing through the switches becomes greater than a threshold level (e.g., greater than an overload level).

The switch controller may also provide temperature protection. For example, the switch controller may be configured to detect the internal temperature of the switch circuit. If the temperature rises beyond a threshold temperature, the switch controller may turn off the switches. As another example, if the internal temperature rises or falls too quickly, the switch controller may turn off the switches.

In some examples, when the current level becomes too high (e.g., an overload condition), the switch controller may turn off the switches, which causes the current level to fall to zero. For robust overload condition detection (e.g., short circuit robustness), the switch controller may turn the switches back on. If there was a short circuit, the current level may rise again and become too high, which causes the switch controller to again turn off the switches. If, however, there was no short circuit, then the current level may not become too high, and may be within a tolerable range. Therefore, by turning the switches off and back on, the switch controller may be able to confirm the existence of a short, circuit.

For example, the switch controller may turn off the switches when the current level becomes too high, then turn on the switches after the current level drops, then again turn off the switches if the current level becomes too high, and so forth. The switch controller may repeat the turning off and turning on of switches for a threshold number of times. If the switch controller had to turn off and turn on the switches for the threshold number of time, the switch controller may confirm that a short circuit exists, and may latch the switches. When latched, the switch controller may not be able to turn the switches back on until a reset event. When latched, the switch circuit may be considered as experiencing a latched overload condition.

In some examples, there may be no available pin on the switch circuit by which the micro-controller may reset the switch circuit. Instead, a pin on the switch circuit that is used for a particular purpose may need to be reused for purposes of resetting the switch circuit. In other words, a pin of the switch circuit may be required to be used for multiple purposes.

Some techniques proposed using a diagnostic enable pin of the switch circuit for enabling the diagnostic of the switch circuit and for resetting the switch circuit in response to a latched overload condition. The diagnostic enable pin (DEN) pin allows the micro-controller to receive diagnostic information of the switch circuit. Some techniques proposed using the DEN pin for the additional purpose of resetting the switch circuit when there is a latched overload condition. However, as described in more detail, without using the techniques described in this disclosure, there may be certain issues with using the DEN pin for purposes of resetting the switch circuit.

For example, when the micro-controller enables the DEN pin (e.g., outputs a digital high to the DEN pin), the switch controller of the switch circuit outputs a diagnostic signal via a diagnostic output pin of the switch circuit (e.g., the IS pin). As one example, the switch controller outputs a current via the diagnostic output pin (e.g., the IS pin), but the switch controller may output a voltage, as another example. Based on the amplitude of the diagnostic signal (e.g., the amplitude of the current or the amplitude of the voltage), the microcontroller may determine the operational condition of the switch circuit. For instance, if the amplitude of the diagnostic signal is less than a threshold amplitude, the micro-controller may determine that the switch circuit is operating normally. If the amplitude of the diagnostic signal is greater than or equal to the threshold amplitude, the micro-controller may determine that the switch circuit experienced a fault condition (e.g., a latched overload condition).

In some other techniques, the amplitude of the diagnostic signal is the same for two different conditions. For instance, in these other techniques, the amplitude of the diagnostic signal when the switch circuit experiences a latched overload condition is the same as the amplitude of the diagnostic signal when the switch circuit experiences an open load in off condition, making it difficult to determine whether the switch experienced the latched overload condition or the open load in off condition.

The open load with no input voltage condition (i.e., open load in off condition) occurs when the switch controller of the switch circuit determines that a load connected to a switch became unconnected and the input voltage to the switch circuit is zero volts. In other words, the open load in off condition occurs when the switch is off, because the input voltage is zero, with an unconnected load. If the impedance at the output of a switch is greater than a threshold impedance, the switch controller of the switch circuit may determine that there is an open load condition. When the switch controller determines that there is no input voltage and determines that there is an open load condition, the switch controller may determine that the switch circuit is experiencing an open load in off condition.

As described above, the amplitude of the diagnostic signal for the latched overload condition and the open load in off condition may be the same. Accordingly, when the micro-controller receives the diagnostic signal, the micro-controller may not be able to accurately determine whether the switch circuit experienced the latched overload condition or the open load in off condition.

Moreover, because the micro-controller may not be able to determine whether the switch circuit experienced the latched overload condition or the open load in off condition, the micro-controller may not be able to determine whether to disable the DEN pin (e.g., output a digital low to the DEN pin) if the DEN pin is used to reset the latched overload condition. For example, if the switch circuit experienced an overload condition, then the micro-controller may not determine that it is safe to disable the DEN pin for purposes of resetting the latched overload condition because to do so may cause the switch circuit to experience another overload condition. However, if the switch circuit experienced an open load in off condition, then the micro-controller may determine that it is safe to disable the DEN pin, but may not disable the DEN pin because the micro-controller may not be able to determine whether a latched overload condition actually occurred or whether an open load in off condition actually occurred.

For these reasons, in some other techniques, the DEN pin may not be a suitable pin for purposes of resetting the switch circuit when the switch circuit experiences a latched overload condition. Also, because of limited space on the switch circuit, it may not be suitable to include an additional reset pin.

In the techniques described in this disclosure, the switch circuit may be configured to output a diagnostic signal at a first amplitude when the switch circuit experiences an overload condition, and output a diagnostic signal at a second, different amplitude when the switch circuit experiences an open load in off condition. As one example, the amplitude of the diagnostic signal when the switch circuit experiences an open load in off condition may be half the amplitude of the diagnostic signal when the switch circuit experiences an overload condition. However, the amplitude of the diagnostic signal for the open load in off condition need not be limited to being half the amplitude of the diagnostic signal for the latched overload condition. In general, any difference in the amplitudes of the diagnostic signal for the open load in off condition and the latched overload condition that the micro-controller can detect may be possible.

In this manner, the micro-controller is able to determine when the switch circuit experienced a latched overload condition and determine when the switch circuit experienced an open load in off condition. Accordingly, based on the techniques described in this disclosure, the micro-controller is able to use the DEN pin for resetting the switch circuit after the switch circuit experiences the latched overload condition. For example, if the micro-controller receives the diagnostic signal at the first amplitude (e.g., indicating the latched overload condition), the micro-controller may reset the latched overload condition when it is safe to do so by disabling the DEN pin (e.g., output a digital low to the DEN pin). In other words, the failing edge of the voltage on the DEN pin may reset the switches (e.g., de-latch the latched switches). If the micro-controller receives the diagnostic signal at the second amplitude (e.g., indicating the open load in off condition), the micro-controller may determine that there is no latched overload condition, and therefore may utilize different criteria to determine when to disable the DEN pin.

For instance, because the micro-controller determined that there is no latched overload condition, the micro-controller may utilize different criteria to determine when to disable the DEN pin, as compared to the criteria that the micro-controller uses to determine when to disable the DEN pin when there is a latched overload condition. In this manner, the DEN pin may function as enabling and disabling the diagnostic functions of the switch circuit, and function as resetting the switch circuit in response to a latched overload condition.

Although the DEN pin is described as being used for the additional purpose of de-latching the switches (i.e., resetting the switch circuit), the techniques described in this disclosure are not so limited. In some examples, rather than the DEN pin, the techniques may utilize a diagnostic select pin, referred to as the DSEL pin. The voltage at the DSEL pin indicates which channel's diagnostic information is to be outputted. For example, the switch circuit may include a first input/output channel and a second input/output channel. In this example, if the voltage at the DEN pin is high, a digital low at the DSEL pin may indicate that the switch circuit is to output the diagnostic information of the first input/output channel, and a digital high at the DSEL pin may indicate that the switch circuit is to output the diagnostic information of the second input/output channel.

In some examples, instead of relying on the DEN pin, the techniques may utilize the DSEL pin for resetting switch circuit (e.g., de-latching the switches of switch circuit) when DEN is active (i.e., a digital high on the DEN pin). The techniques may reset the switch circuit on a rising or falling edge of the DSEL pin. In this manner, the techniques utilize the DSEL pin for multiple purposes: one purpose is to select the channel whose diagnostic information is to be outputted, and the other purpose is to reset the switch circuit in response to a latched overload condition.

FIG. 1 is a block diagram illustrating an example load driver system. As illustrated, load driver system 10 includes micro-controller 12, switch circuit 14, and a plurality of loads 16A-16F (collectively referred to as loads 16). Load driver system 10 may be part of automotive applications (e.g., a module of an automotive application); although the techniques described in this disclosure may be used for applications other than automotive applications. Examples of loads 16 include motors, relays, bulbs, light emitting diode (LED) modules for interior or exterior lighting, and the like.

Micro-controller 12 may be formed as one or more digital signal processors (DSPs), general purpose microprocessors, application specific integrated circuits (ASICs), field programmable logic arrays (FPGAs), or other equivalent integrated or discrete logic circuitry. Accordingly, the term "micro-controller," as used herein may refer to any of the foregoing structure or any other structure suitable for implementation of the techniques described herein. In addition, in some aspects, the functionality described herein may be provided within dedicated hardware and/or software modules configured for implementing the techniques described in this disclosure. Also, the techniques could be fully implemented in one or more circuits or logic elements.

Switch circuit 14 may be formed as an integrated circuit (IC). As illustrated in FIG. 1, switch circuit 14 is formed as an IC chip. It should be understood that FIG. 1 illustrates one example of switch circuit 14 and the techniques described in this disclosure are not limited to example illustrated in FIG. 1. For instance, in FIG. 1, switch circuit 14 includes two inputs (IN0 and IN1) and each input is associated with three outputs (e.g., OUT0-OUT2 for IN0 and OUT3-OUT5 for IN1). In some examples, OUT0-OUT2 may be connected together and OUT3-OUT5 may be connected together (e.g., internally or on a circuit board layout). The configuration of switch circuit 14 illustrated in FIG. 1 should not be considered limiting. In some examples, there may be only one input or more than two inputs. In some examples, each input may be associated with one or more outputs (e.g., more or less than three outputs per input). Moreover, in some examples there may be multiple switch circuits 14 in parallel and coupled to micro-controller 12. In some of these examples, the multiple switch circuits 14 may share a common IS pin.

The GND pin of switch circuit 14 is the ground pin of switch circuit 14. The dashed rectangle within switch circuit 14 forms the power plane of switch circuit 14. For example, the power plane of switch circuit 14 couples to the power plane of the circuit board on which switch circuit 14 resides. The power plane of the circuit board is coupled to the power source that is referenced to the same potential as the plane of the circuit board to which the GND pin of switch circuit 14 is coupled. The voltage at the power plane may be referred to as the supply voltage (Vs). In automotive applications, the car battery may supply the Vs voltage.

The pins labeled no connect (NC) are pins that may not be connected to any other components. For instance, the pins labeled NC may be used during manufacturing to ensure that switch circuit 14 is functioning correctly, but may not have any practical use when switch circuit 14 is used in load driver system 10. The NC pins may not be necessary in every example of switch circuit 14.

The pins labeled IN0 and IN1 form the input to switch circuit 14, and the pins labeled OUT0-OUT5 form the output of switch circuit 14. For example, micro-controller 12 outputs a voltage to the IN0 and IN1 pins, and based on the voltage, switch circuit 14 outputs or does not output currents through the OUT0-OUT5 pins.

The voltage at the diagnostic enable pin (DEN) pin indicates whether switch circuit 14 is to output diagnostic information. For example, when micro-controller 12 determines that a diagnostic of switch circuit 14 is to be performed, micro-controller 12 outputs a voltage (e.g., a digital high) to the DEN pin, and in response switch circuit 14 outputs the diagnostic information.

For instance, switch circuit 14 outputs the diagnostic information from the diagnostic output pin (i.e., sense pin and also referred to as the IS pin). As one example, switch circuit 14 outputs the diagnostic information as a current, and as another example, switch circuit 14 outputs the diagnostic information as a voltage. In this disclosure, the term "diagnostic signal" is used generally as the signal that switch circuit 14 outputs that includes the diagnostic information. In other words, one example of the diagnostic signal is a current, and another example of the diagnostic signal is a voltage.

The diagnostic select pin, referred to as the DSEL pin, indicates on which input/output pair the diagnostic is to be performed (e.g., which channel is to be diagnosed). For example, assume that OUT0-OUT2 are connected together and OUT3-OUT5 are connected together, and in this examples, the input pin IN0 and the output pins OUT0-OUT2 may form one input/output pair (e.g., one channel), and the input pin IN1 and the output pins OUT3-OUT5 may form another input/output pair (e.g., another channel). In this example, if micro-controller 12 outputs a digital low to the DSEL pin, switch circuit 14 may output a diagnostic signal indicating the diagnostic information related to the IN0 and OUT0-OUT2 input/output pair. If micro-controller 12 outputs a digital high to the DSEL pin, switch circuit 14 may output a diagnostic signal indicating the diagnostic information related to the IN1 and OUT3-OUT5 input/output pair.

Switch circuit 14 includes a plurality of switches. For example, switch circuit 14 includes six OUT0-OUT5 pins, and each one of the pins may be coupled to a respective switch of switch circuit 14. In some examples, the switches may be formed as transistors such as metal-oxide-semiconductor field-effect-transistor (MOSFETs), insulated-gate bipolar transistors (IGBTs), gallium arsenide field-effect transistors (GaAsFETs), Gallium Nitride transistors (GaNFETs), or bipolar junction transistors (BJTs).

The switch controller of switch circuit 14 controls the switches such that when the switches are closed, current flows to respective loads 16, and when the switches are open current does not flow to respective loads 16. For example, when the voltage at the IN0 pin of switch circuit 14 is high (e.g., a digital high as the input voltage at the IN0 pin), the switch controller of switch circuit 14 may close the switches connected to OUT0-OUT2 pins and cause current to flow to loads 16A-16C, and when the voltage at the IN0 pin of switch circuit 14 is low (e.g., a digital low as the input voltage at the IN0 pin), the switch controller of switch circuit 14 may open the switches connected to the three OUT0-OUT2 pins and cause no current to flow to loads 16A-16C. When the voltage at the IN1 pin of switch circuit 14 is high (e.g., a digital high as the input voltage at the IN1 pin), the switch controller of switch circuit 14 may close the switches connected to the three OUT3-OUT5 pins and cause current to flow to loads 16D-16F, and when the voltage at the IN1 pin of switch circuit 14 is low (e.g., a digital low as the input voltage at the IN1 pin), the switch controller of switch circuit 14 may open the switches connected to the three OUT3-OUT5 pins and cause no current to flow to loads 16D-16F.

In some examples, micro-controller 12 may output a pulse width modulated (PWM) voltage signal as the input voltage signal to the IN0 and/or IN1 pins; although other types of modulation may be possible. For illustration, the techniques described in this disclosure are described with respect to the PWM voltage signal. The PWM voltage signal to the IN0 pin may be the same or different than the PWM voltage signal to the IN1 pin. The on-time and frequency of the PWM voltage signal may be referred to as a duty cycle. Micro-controller 14 may determine the duty cycle of the PWM voltage signals to respective IN0 and IN1 pins.

In some examples, for automotive applications, the duty cycle of the PWM voltage signal may depend on the applied car battery voltage, referred to as the Vs voltage. The Vs voltage is a mean to modulate the power delivered to loads 16. For example, when the switches are closed, current flows from the car battery through the switches, and out of OUT0 and/or OUT1 to respective loads 16.

In addition to turning the switches coupled to OUT0 and OUT1 on and off, the switch controller of switch circuit 14 may provide overload protection, also referred to as fault protection. Overload protection refers to the switch controller turning off the switches coupled to OUT0 and/or OUT1 in response to detecting an overload condition. Examples of the overload condition include the switches outputting more current than a threshold current level (e.g., due to a short-circuit), the internal temperature of switch circuit 14 rises above or falls below a threshold temperature, or the internal temperature of switch circuit 14 rises or falls faster than a threshold rate of temperature change. There may be additional examples of overload conditions, and the techniques described in this disclosure are not limited to the examples described above.

For overload protection, in response to the switch controller detecting an overload condition, the switch controller may open the switches coupled to one or more of the output pins so that no current flows to loads 16. In this way, if switch circuit 14 experiences an overload condition, the switch controller can take protective measures. For instance, a short-circuit may cause more than a tolerable amount of current to flow through the switches. Such high amplitude current may damage the switches within switch circuit 14 or potentially cause issues with loads 16.

In some cases, the switch controller may provide robust overload protection, in which the switch controller confirms the existence of an overload condition. For example, the switch controller may detect an overload condition, and in response open the switches coupled to one or more of loads 16. However, it may be possible that the switch controller inadvertently detected the overload condition, when one did not exist. To confirm the existence of the overload condition, the switch controller may close the previously opened switches coupled to one or more loads 16, and determine whether an overload condition occurs. For instance, if there was a short-circuit, then the current flowing through the switches may once again become greater than the tolerable amount of current that can flow through the switches. In this case, the switch controller may once again detect the overload condition, and open the switches coupled to one or more loads 16.

The switch controller may repeat the opening and closing of the switches a plurality of times up to a threshold number of times to confirm the existence of the overload condition. As one example, the switch controller may be configured to repeat the opening and closing of switches up to four times; however, opening and closing the switches more or less than four times is possible. If the switch controller opens and closes the switches up to the threshold number of times (e.g., four times in the previous example), the switch controller may confirm the existence of the overload condition.

After confirming the existence of the overload condition, the switch controller may latch the switches coupled to the one or more loads 16. When latched, switch circuit 14 may be considered having experienced a latched overload condition. For example, the switches may be open after the last occurrence of the overload condition, and when latched, the switch controller may not close the switches until receiving a reset signal from micro-controller 12.

However, as illustrated in FIG. 1, switch circuit 14 may not include a dedicated reset pin for the reset signal. In some cases, to keep the cost down and/or the size of switch circuit 14 small, it may be desirable to not include a reset pin on switch circuit 14. Instead, an existing pin of switch circuit 14 may be used for multiple purposes. For example, one of the pins that is dedicated for one purpose may be reused for the purposes of resetting switch circuit 14 to de-latch the switches.

Figure 2A:
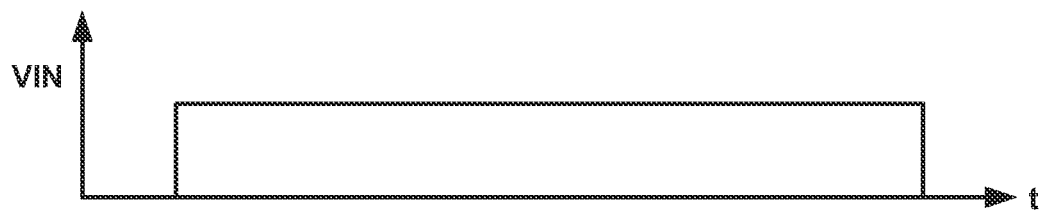
FIGS. 2A and 2B are graphical diagrams illustrating one example of a latched overload condition over time.
Figure 2B:

FIGS. 2A and 2B are graphical diagrams illustrating one example of a latched overload condition over time. For example, FIG. 2A illustrates an input voltage (VIN) (e.g., the voltage at either 1N0 or IN1) as a function of time, and FIG. 2B illustrates the current flowing through one of the switches (IDS) connected to one of loads 16 as a function of time. As described above, the switches of switch circuit 14 may be formed with transistors such as MOSFETs. The current IDS refers to the current (I) flowing into the drain (D) of the MOSFET and out of the source (S) of the MOSFET that forms the switch, and therefore, the current is labeled IDS. The current flowing through the switches (i.e., IDS) may be the same current or proportional to the current that flows to loads 16 (ILOAD). Accordingly, this disclosure may use the term ILOAD and IDS interchangeably.

As illustrated in FIG. 2A, in response to the VIN being a digital high, current flows through a switch. This is because in response to the VIN being a digital high, the switch controller closes the switch. Then, if a short-circuit exists (i.e., an overload condition), the IDS current flowing through the switch may become greater than a threshold current, as illustrated by the first peak in FIG. 2B. In response, the switch controller may open the switch causing the IDS current to drop, as illustrated by the first valley in FIG. 2B. To confirm the existence of the short-circuit, the switch controller may close the switch again, and because the short-circuit still exists, the IDS current flowing through the switch may ramp back up again and become greater than the threshold current, as illustrated by the second peak in FIG. 2B. In this case, the switch controller may once again open the switch and cause the IDS current to drop back down to zero, as illustrated by the second valley in FIG. 2B.

Although not illustrated in FIG. 2B (or in FIG. 3B), in some examples, the switch controller may delay the closing of the switches for cooling purposes. For instance, after the switch controller opens the switches and the current flowing through the switches drops to zero, the switch controller may delay the closing of the switches for a certain time due to thermal overheating. In these examples, the switch controller may keep the switches in an open state until there is sufficient cooling before closing the switches. In this way, there may be a certain time between the four pulses due to thermal overheating.

In the example illustrated in FIGS. 2A and 2B, the switch controller may close and open the switch up to four times, and hence four peaks are illustrated in FIG. 2B, and after the fourth peak may confirm the existence of an overload condition. For instance, the switch controller may include a counter that counts the number of times the switch controller closed and opened the switches during the time that VIN is high. When the count reaches a threshold number of times (e.g., four times in this example), the switch controller confirms the existence of an overload condition and latches the switch open.

For instance, as illustrated in FIG. 2B, although VIN is high, there is no IDS current after the fourth peak of the IDS current. In this case, the switch controller opened the switch and kept the switch open even though VIN is high (i.e., latched the switch). The switch controller may keep the switch open until a reset signal.

As described above and illustrated in FIG. 1, switch circuit 14 does not include a dedicated reset pin and an existing pin may need to be used for multiple purposes (e.g., for the purpose to which it is assigned and for resetting switch circuit 14 so that the switch controller de-latches the latched switches). There may be multiple options for pins that can be reused for resetting purpose.

As one example, it may be possible to use one of the input voltage pins (e.g., IN0 or IN1) for purposes of resetting as well as for purposes of receiving the input voltage. This example is further illustrated in FIGS. 3A and 3B.

Figure 3A:
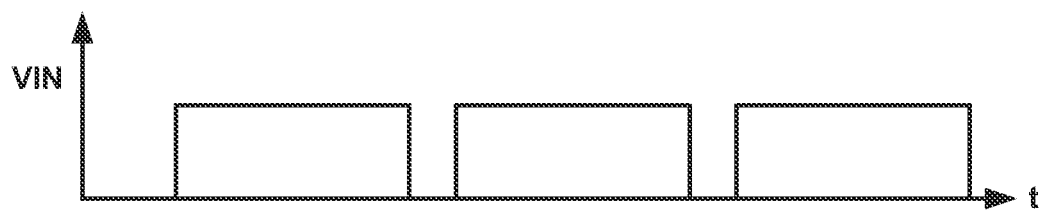
FIGS. 3A and 3B are graphical diagrams illustrating an example way in which to reset switches in response to a latched overload condition over time.
Figure 3B:
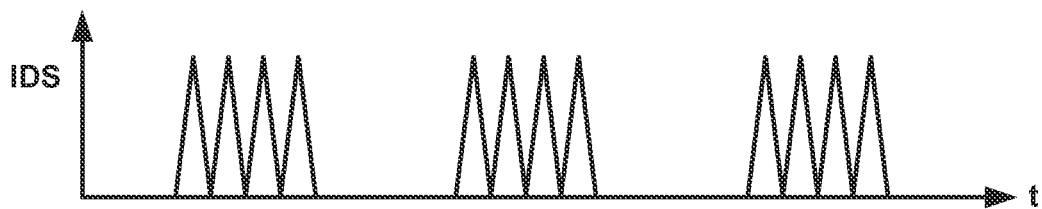

FIGS. 3A and 3B are graphical diagrams illustrating an example way in which to reset switches in response to a latched overload condition over time. For instance, as one example, micro-controller 12 may reset switch circuit 14 by transitioning the input voltage (VIN) from a digital high to a digital low. In response to detecting the input voltage transitioned from a digital high to a digital low, the switch controller may de-latch the switches coupled to one or more loads 16. In other words, when the input voltage is low or in response to the input voltage transitioning from a high to a low, the switch controller may de-latch the switches coupled to one or more loads 16.

For instance, FIG. 3A illustrates the input voltage, and FIG. 3B illustrates the IDS current. As illustrated in FIGS. 3A and 3B, after VIN first transitions from a digital low to a digital high, the IDS current ramps to above the threshold. In this case, while VIN is high, the switch controller opens and closes the switches similar to the description above with respect to FIGS. 2A and 2B, and then latches the switches so no current can flow (e.g., counts up to four peaks, and latches the switches after the fourth peak). As illustrated in FIG. 3B, although VIN is high, there is no IDS current flowing.

Then, micro-controller 12 may transition the VIN voltage from a digital high to a digital low. In the example illustrated in FIGS. 3A and 3B, when the VIN voltage is a digital low or in response to a transition of the VIN voltage from a digital high to a digital low, the switch controller de-latches the switches so that the IDS current can flow again. However, while the VIN voltage is a digital low, the switches may remain open.

As illustrated in FIG. 3A, micro-controller 12 may transition the VIN voltage from a digital low back to a digital high. In this case, because the digital low of VIN caused switch circuit 14 to reset, the switch controller may close the switches. As illustrated in FIG. 3B, the short-circuit may still persist, causing the IDS current to ramp beyond the threshold, and causing the switch controller to implement the protection mechanism of confirming the existence of the overload condition. For instance, the switch controller may close and open switches, and if the number of times the switch controller closed and opened the switches equals four (four peaks), the switch controller may latch the switches so they cannot be closed until a reset signal (which in this example is VIN becoming low).

Using the input voltage pins for the additional purpose of resetting may be problematic. For instance, the switches become de-latched every cycle PWM signal, which as illustrated in FIG. 3B, results in many short circuit pulses (e.g., the IDS current ramping up and down every time VIN becomes high). Such repeated opening and closing of the switches of switch circuit 14 may reduce the robustness of the switches. Accordingly, reusing the input voltage pins (e.g., IN0 or IN1 for the additional purpose of resetting switch circuit 14 may not be desirable.

In some cases, it may be possible to use the DEN pin of switch circuit 14 for the additional purpose of resetting switch circuit 14. For example, as described above, micro-controller 12 uses the diagnostic enable pin (DEN pin) to enable or disable the reception of diagnostic information (e.g., the diagnostic signal output by the sense (IS) pin). In some cases, micro-controller 12 may utilize the DEN pin for resetting switch circuit 12 (i.e., de-latching the switches of switch circuit 14 after a latched overload condition).

FIGS. 4A-4D are graphical diagrams illustrating another example way in which to reset switches in response to a latched overload condition and illustrating the resulting diagnostic information over time. For instance, FIGS. 4A-4D illustrate that case where the DEN pin is reused for the additional purpose of resetting switch circuit 14.

Figure 4A:
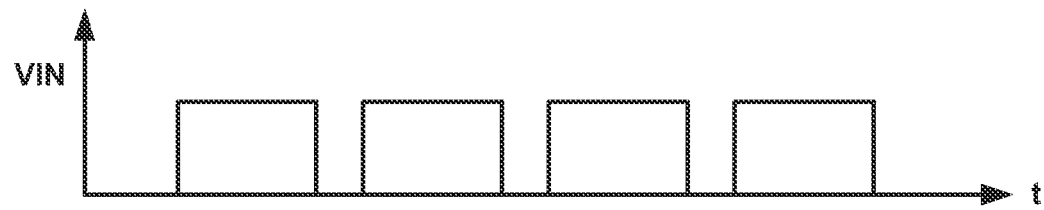
FIGS. 4A-4D are graphical diagrams illustrating another example way in which to reset switches in response to a latched overload condition and illustrating the resulting diagnostic information over time.
Figure 4B:

In FIG. 4A, micro-controller 12 outputs a digital high to one of IN0 or IN1 of switch circuit 14 (e.g., VIN is high). As illustrated in FIG. 4B, due to a short-circuit, the IDS current rises above the threshold level, the switch controller opens the switches, the IDS current drops, the switch controller closes the switches, the IDS current rises again, and the switch controller repeats these steps so that there are total of four peaks (similar to the examples in FIGS. 2B and 3B). The switch controller then latches the switches.

As illustrated in FIG. 4A, the VIN voltage may be a PWM voltage signal. For instance, micro-controller 12 may toggle the VIN voltage level low, and subsequently toggle the VIN voltage level high again. However, in this example, as illustrated in FIG. 4B, the switch controller may not close the latched switches. For instance, as illustrated in FIG. 4B, during the second instance when VIN is high, there is no IDS current. This is because, as illustrated in FIG. 4C, the voltage at the DEN pin (VDEN) is low during the entire second instance of when VIN in high, and therefore, the switches remain latched in the open position.

Figure 4C:

As illustrated in FIGS. 4A and 4C, during the third cycle of when VIN is high, micro-controller 12 may output a digital high to the DEN pin (i.e., VDEN is high during the third instance of when VIN is high). When the voltage at the DEN pin is high, the switch controller of switch circuit 14 outputs diagnostic information. For example, the switch controller may output a diagnostic signal via the diagnostic output pin (IS pin) of switch circuit 14 that indicates the diagnostic information.

Figure 4D:
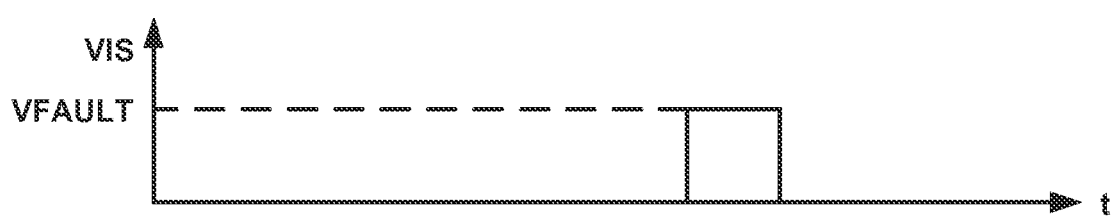

FIG. 4D illustrates a voltage VIS which is based on a current outputted by the switch controller. For example, the IS pin of switch circuit 14 may be coupled to a resistor (not shown), and the current flowing out of the IS pin creates a voltage across the resistor. This voltage across the resistor is labeled VIS.

As illustrated in FIG. 4D, the amplitude of the VIS voltage is VFAULT. When switch circuit 14 experienced a latched overload condition (as illustrated in FIG. 4B), the switch controller may set the IS current such that the voltage across the resistor coupled to the IS pin equals VFAULT (e.g., the amplitude of the IS current equals IFAULT). When micro-controller 12 determines that the voltage at the IS pin is equal to VFAULT, micro-controller 12 may determine that switch circuit 14 experienced a latched overload condition. In examples where the IS pin of switch circuit 14 is not coupled a resistor, micro-controller 12 may receive the IS current from switch circuit 14. In these examples, micro-controller 12 may determine the amplitude of the IS current, and if the amplitude is equal to IFAULT, micro-controller 12 may determine that switch circuit 14 experienced a latched overload condition. In other words, the switch controller of switch circuit 14 may output a diagnostic signal via the IS pin (i.e., a current or a voltage). Micro-controller 12 receives the diagnostic signal and determines the diagnostic information from the diagnostic signal (e.g., determine whether switch circuit 14 experienced a latched overload condition based on the amplitude of the diagnostic signal).

As illustrated in FIG. 4C, micro-controller 12 may transition the voltage at the DEN pin (VDEN) from a digital high back to a digital low. In response to the VDEN being low, the switch controller of switch circuit 14 may stop outputting a diagnostic signal. For example, as illustrated in FIG. 4D, the switch controller of switch circuit 14 stops outputting the VIS voltage (e.g., stops outputting a current).

In the example illustrated in FIGS. 4A-4D, the voltage at the DEN pin de-latches the latched switches of switch circuit 14 (i.e., resets switch circuit 14). For instance, after the VDEN voltage drops back down to zero (e.g., a digital low), the switches of switch circuit 14 become de-latched (i.e., the switches de-latch on a falling edge of the DEN voltage). Then during the next instance that VIN is high, as illustrated by the fourth cycle of when VIN is high, the switch controller of switch circuit 14 closes the switches and allows the IDS current to flow through because the switches are de-latched in response to the VDEN voltage being low. As illustrated in FIG. 4B, if the short-circuit still persists, then the IDS current will become too high (i.e., greater than the threshold amplitude), the switch controller will open the switches, then close the switches to confirm the short-circuit, and this process repeats until the switch controller latches the switches (e.g., after four times) as described above.

However, without using the techniques described in this disclosure, there may be drawbacks with using the DEN pin for purposes of enabling diagnostics and for purposes of resetting switch circuit 14 (i.e., de-latching latched switches). As described in more detail, without using the techniques described in this disclosure, the reason the DEN pin may not be well suited for purposes of resetting switch circuit 14 may be because micro-controller 12 may not be able to distinguish between different types of diagnostic information without using the techniques described in this disclosure.

As described above, the switch controller may be configured to output diagnostic information indicating that switch circuit 14 experienced a latched overload condition. In some examples, the switch controller may also be configured to output diagnostic information indicating that switch circuit 14 experienced an open load with no input voltage condition, also referred to as an open load in off condition. For example, for automotive applications, it may be requirement for compliance that switch circuit 14 output both types of diagnostic information (e.g., a diagnostic signal indicating whether switch circuit 14 experienced a latched overload condition and a diagnostic signal indicating whether switch circuit 14 experienced an open load in off condition).

The open load with no input voltage condition (i.e., open load in off condition) refers to the condition whether there is no load connected to the output of a switch of switch circuit 14 when the input voltage equals a digital low (e.g., 0V). For example, it may be possible that during operation, one of loads 16 becomes disconnected (e.g., due to a car accident in an automotive application, although other reasons for the disconnection are possible). Switch circuit 14 may be configured to output diagnostic information, when the voltage at the DEN pin is high, that indicates whether switch circuit 14 experienced a condition when one of loads 16 was not connected and the input voltage was a digital low (e.g., 0V) (i.e., indicates the open load in off condition).

It should be understood that the open load in off condition does not mean that while the input voltage was low, one of loads 16 became disconnected. Rather, the open load in off condition means that there happened to be a time when one of the output pins, which should have been connected to one of loads 16, was not connected to one of loads 16 and the input voltage was at zero volts. When switch circuit 14 experiences an open load in off condition, in response to the voltage at the DEN pin being high, the switch controller may output a diagnostic signal via the diagnostic output pin (IS pin) indicating that switch circuit 14 experienced an open load in off condition.

Also, as described in more detail, in some examples, the output pins of switch circuit 14 may be coupled to respective capacitors coupled in parallel with loads 16. In these examples, the capacitors may remain in place even when one or more of loads 16 become disconnected. Accordingly, in some examples, it may not be necessary for the output pins to be completely disconnected for there to be an open load with no input voltage condition (i.e., open load in off condition). Rather, the respective capacitors may still be coupled to respective output pins for there to be an open load in off condition.

In some cases, where the techniques described in this disclosure are not utilized, the amplitude of the diagnostic signal indicating a latched overload condition and the amplitude of the diagnostic signal indicating an open load in off condition may be the same. Because the amplitudes of these diagnostic signals may be the same, micro-controller 12 may not be able to determine whether switch circuit 14 experienced a latched overload condition or an open load in off condition.

Figure 5A:
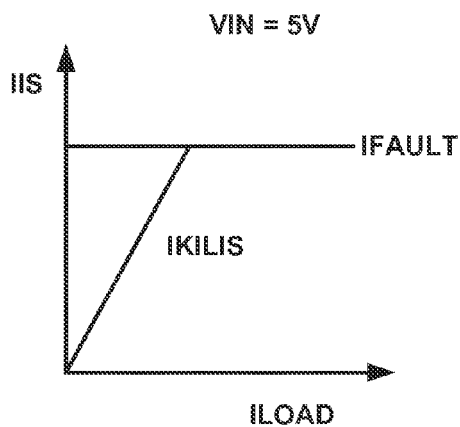
FIGS. 5A-5C are graphical diagrams illustrating examples of diagnostic signals in response to a latched overload condition and an open load in off condition.
Figure 5B:
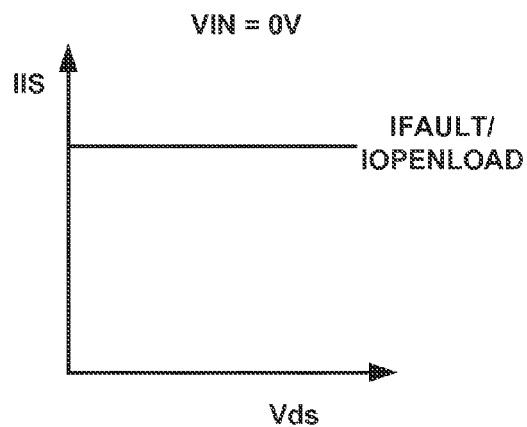
Figure 5C:
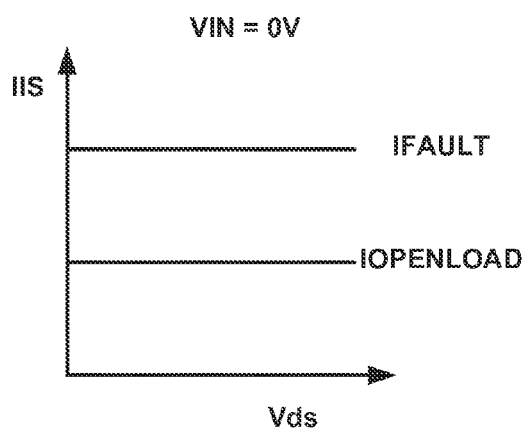

FIGS. 5A-5C are graphical diagrams illustrating examples of diagnostic signals in response to a latched overload condition and an open load in off condition. In normal operating condition, when the voltage at the DEN pin is high, the switch controller of switch circuit 14 may output a current from the diagnostic output pin (i.e., the IIS from the IS pin) that is proportional to the current outputted via the output pins (i.e., ILOAD). As noted above, in this disclosure, the terms IDS (current through the switches of switch circuit 14) and ILOAD (current to one or more loads 16) may be used interchangeably. Switch circuit 14 being in normal operating condition means that switch circuit 14 has not experienced a latched overload condition or an open load in off condition.

In other words, during normal operation, switch circuit 14 may output diagnostic information indicative of the amount of current flowing to loads 16 (i.e., amount of load current). The diagnostic information indicative of the amount of current flowing to loads 16 may be a diagnostic signal whose amplitude is proportional to the current flowing to loads 16. For instance, the switch controller of switch circuit. 14 may be preconfigured with a ratio parameter, referred to as the "kilis" ratio. In some examples, the switch controller may divide the amplitude of the current flowing to loads 16 (i.e., load current) with the ratio parameter (i.e., kilis ratio), and output the diagnostic current with an amplitude equal to the amplitude of the load current divided by the ratio parameter.

For instance, FIG. 5A illustrates a slope labeled IKILIS when the input voltage is a digital high (e.g., 5V). For a given amplitude of the load current (i.e., ILOAD or IDS) within normal operating range, the IIS current equals ILOAD divided by kilis. For this reason, IKILIS is illustrated as a straight line with a fixed slope. As one example, the ratio parameter (i.e., kilis ratio) may be equal to 3000. In this example, if ILOAD equals 3 A, then IIS equals 1 mA (i.e., 3 A/3000). In these sense, when switch circuit 14 is outputting current with VIN being a digital high and the DEN voltage being a digital high, as long as the ILOAD is within normal operating range, the switch controller may output a current via the diagnostic output pin (i.e., the IS pin) that is proportional to a replica of the load current ILOAD. Micro-controller 12 may receive the IIS current, and based on the amplitude of the IIS current and the kilis ratio, determine the amount of current flowing to loads 16 (i.e., determine the amplitude of ILOAD).

In case of an overload or a short-circuit (e.g., in response to a latched overload condition), the switch controller of switch circuit 14 may output a fixed amplitude IIS current (e.g., 10 mA). In this example, when there is an overload or short-circuit condition, the amplitude of the IIS current may be larger than maximum allowable ILOAD current divided by the kilis ratio. For example, assume that the kilis ratio is 3000 and assume that the maximum allowable amplitude for ILOAD is 29 A. In other words, if the switch controller determines that the ILOAD current is greater than 29 A, the switch controller may determine that an overload condition is reached, and may open and close switches as described above.

In this example, with the voltage at the DEN pin being high and the voltage at IN0 and/or IN1 being high, the switch controller may output a current IIS equal to ILOAD/kilis ratio up to ILOAD being equal to 29 A. For instance, if micro-controller 12 receives the IS current in range of 0-9.67 mA (i.e., 0/3000 to 29/3000), micro-controller 12 may determine that switch circuit 14 is operating in the normal range and has not experienced a latched overload condition. However, if micro-controller 12 determines that the amplitude of the IS current is 10 mA, micro-controller 12 may determine that switch circuit 14 experienced a latched overload condition.

For example, FIG. 5A illustrates the IFAULT current. The IFAULT current represents the current that switch circuit 14 outputs via the diagnostic output pin (IS pin) when switch circuit 14 experiences a latched overload condition. As illustrated in FIG. 5A, the amplitude of the IFAULT current may be equal to or slightly greater than the maximum allowable amplitude of ILOAD divided by the kilis ratio. Also, the amplitude of the IFAULT current may be fixed, and not proportional to the amplitude of ILOAD.

In the above examples, switch circuit 14 may output a diagnostic signal indicative of a latched overload condition. However, switch circuit 14 may be configured to output a diagnostic signal indicative of other conditions as well. For example, as described above, switch circuit 14 may be configured to output a diagnostic signal indicative of an open load in off condition. The open load in off condition may be a condition where there is no input voltage on the IN0/TN1 pins and no load 16*s* is connected to the output pins. Indicating that switch circuit 14 experienced an open load in off condition may be a requirement for users of switch circuit 14 and micro-controller 12 (e.g., of system 10).

There may be various ways in which the switch controller of switch circuit 14 may detect the open load in off condition, and the techniques described in this disclosure are not limited to any particular manner in which the open load in off condition is detected. As one example, one of the requirements of switch circuit 14 may be that when there is no load, the output of the switch is to float to a digital high. In this case, if the switch controller determines that VIN is low and determines that voltage at the output of switch circuit 14 is high, the switch controller may determine that switch circuit 14 experienced an open load in off condition.

In some examples, if switch circuit 14 experiences an open load in off condition, the switch controller of switch circuit 14 may output a diagnostic signal indicating that switch circuit 14 experienced an open load in off condition in response to the voltage at the DEN pin being high. However, it may be possible that the diagnostic signal indicating the open load in off condition is the same diagnostic signal indicating the overload condition. In such a situation it may not be possible for micro-controller 12 to determine whether switch circuit 14 experienced the overload condition or experienced the open load in off condition.

For example, FIG. 5B illustrates the current output from the diagnostic output pin (i.e., IIS current from the IS pin) in response to switch circuit 14 experiencing an overload condition and switch circuit 14 experiencing an open load in off condition. In FIG. 5B, the input voltage VIN (e.g., at IN0/TN1) is zero volts and there is no load 16 connected (in case of VIN being low and load 16 being connected the ILOAD current is zero). Because VIN is low, there is no output current. Accordingly, the x-axis of FIG. 5B is labeled Vds, where Vds is the drain-source voltage of the power transistor that form the switch of switch circuit 14. In some examples, if Vds is a complex value (e.g., includes real and imaginary component), the x-axis in FIG. 5B may represent the modulus of Vds. The IFAULT current represents the diagnostic signal indicative of the overload condition, and the IOPENLOAD current represents the diagnostic signal indicative of the open load in off condition.

As illustrated, the amplitude of both the IFAULT current and IOPENLOAD current is the same. Accordingly, if the voltage on DEN is high and micro-controller 12 receives a current from the IS pin whose amplitude is equal to IFAULT, micro-controller 12 may not be able to determine whether switch circuit 14 experienced an open load in off condition or an overload condition because the amplitude of IFAULT and IOPENLOAD is the same. Additionally, the diagnostic signals indicating the open load in off and overload conditions being the same also means that the DEN pin is not well suited to be used to reset the switches of switch circuit 14 in response to a latched overload condition.

For example, micro-controller 12 may receive a current from the diagnostic output pin (IS pin) in response to a digital high on the DEN pin, and micro-controller 12 may determine that the amplitude of the current is equal to IFAULT. In this example, micro-controller 12 may determine that some condition occurred (e.g., an overload condition or an open load in off condition), but may not be able to resolve which condition occurred. For example, micro-controller 12 may misdiagnose the condition and determine that switch circuit 14 experienced an open load in off condition, when switch circuit 14 experienced the latched overload condition. In this example, even though it may be unsafe to de-latch the switches of switch circuit 14, micro-controller 12 may output a digital low to the DEN pin causing the switches to de-latch because micro-controller 12 incorrectly determined that switch circuit 14 experienced an open load in off condition when micro-controller 12 experienced a latched overload condition. Moreover, micro-controller 12 may indicate that switch circuit 14 experienced an open load in off condition when switch circuit 14 experienced no such open load in off condition.

Similarly, switch circuit 14 may experience an open load in off condition, and micro-controller 12 may incorrectly determine that switch circuit 14 experienced the latched overload condition (again, because the amplitudes of IFAULT and IOPENLOAD are the same). In this example, micro-controller 12 may unnecessarily keep the voltage at the DEN pin high so as to not reset the switches of switch circuit 14. Furthermore, micro-controller 12 may indicate that switch circuit 14 experienced the latched overload condition when switch circuit 14 experienced the open load in off condition.

For example, in FIGS. 5A and 5B, if VIN is high (e.g., 5V) and the DEN voltage is high, then if there is an open load and there has been no latched overload condition, switch circuit 14 may not output a current on the diagnostic output pin (IS pin). If VIN in high (e.g., 5V) and the DEN voltage is high, then if there is a latched overload condition, switch circuit 14 may output a current on the diagnostic output pin equal to IFAULT. If VIN is low (e.g., 0V) and the DEN voltage is high, then if there is an open load in off condition, switch circuit 14 may output a current on the diagnostic output pin equal to IOPENLOAD. If VIN is low (e.g., 0V) and the DEN voltage is high, then if there is a latched overload condition, switch circuit 14 may output a current on the diagnostic output pin equal to IFAULT. However, because IOPENLOAD and IFAULT are the same amplitude, micro-controller 12 may not be able to distinguish which condition switch circuit 14 experienced.

In the techniques described in this disclosure, switch circuit 14 may be configured to determine whether switch circuit 14 experienced a latched overload condition or an open load within no input voltage condition (i.e., open load in off condition), output a first diagnostic signal indicating the latched overload condition, and output a second, different diagnostic signal indicating the open load in off condition. As one example, the amplitude of the first diagnostic signal indicating the latched overload condition and the amplitude of the second diagnostic signal indicating the open load in off condition may be different. For instance, the amplitude of the first diagnostic signal indicating the latched overload condition may be twice the amplitude of second diagnostic signal indicating the open load in off condition, although other examples of differences in the amplitude are possible.

As another example, rather than outputting a steady current out of the IS pin to indicate the latched overload condition and the open load in off condition, the switch controller of switch circuit 14 may be configured to output a pulse with a first amplitude or a first frequency as the first diagnostic signal indicating the latched overload condition, and may be configured to output a pulse with a second, different amplitude or a second, different frequency as the second diagnostic signal indicating the open load in off condition. There may be other ways in which the first diagnostic signal indicating the latched overload condition and the second diagnostic signal indicating the open load in off condition may be different, and the techniques described in this disclosure should not be considered limited to the above examples.

For purposes of illustration only, the techniques are described with respect to the first diagnostic signal indicating the latched overload condition being a current whose amplitude is twice the amplitude of the current of the second diagnostic signal indicating the open load in off condition. For example, FIG. 5C illustrates the IFAULT current and the IOPENLOAD current. In FIG. 5C, the input voltage VIN is equal to zero volts. Similar to FIG. 5B, because VIN is low, there is no output current. Accordingly, the x-axis of FIG. 5C is labeled Vds, where Vds is the drain-source voltage of the power transistor that form the switch of switch circuit 14. In some examples, if Vds is a complex value (e.g., includes real and imaginary component), the x-axis in FIG. 5C may represent the modulus of Vds. As illustrated, if switch circuit 14 experiences a latched overload condition, the switch controller of switch circuit 14 outputs a current with a first amplitude via the diagnostic output pin (IS pin) indicating the latched overload condition (i.e., the IFAULT current). As also illustrated, if switch circuit 14 experiences an open load in off condition, the switch controller of switch circuit 14 outputs a current with a second amplitude via the diagnostic output pin indicating the open load in off condition (i.e., the IOPENLOAD current).

In this manner, micro-controller 12 may be able to determine whether switch circuit 14 experienced a latched overload condition or an open load in off condition. For example, micro-controller 12 may receive a current from the IS pin of switch circuit 14, where the current is a diagnostic signal indicative of a condition experienced by switch circuit 14, Micro-controller 12 may determine the amplitude of the current, and if the amplitude is equal to IFAULT, micro-controller 12 may determine that switch circuit 14 experienced a latched overload condition. If the amplitude is equal to IOPENLOAD, micro-controller 12 may determine that switch circuit 14 experienced an open load in off condition.

Accordingly, the DEN pin of switch circuit 14 may be configured to implement multiple functions. For example, the DEN pin may be configured to enable/disable the diagnostic functions, and in addition may be configured to de-latch the switches of switch circuit 14 when the switches are latched due to the latched overload condition. For example, a transition of the voltage at the DEN pin from high to low (e.g., a falling edge of the voltage on the DEN pin) may cause the switches to de-latch. Utilizing the DEN pin for multiply functions allows resetting switch circuit 14 (e.g., de-latching the switches) without needing an extra reset pin.

Furthermore, although the example above describes using the DEN pin for the additional purpose of de-latching the switches latched in response to a latched overload condition, the techniques are not so limited. In some examples, the DSEL pin may be used for the additional purpose of de-latching the switches instead of or in addition to the DEN pin. For example, reusing the DSEL pin for the purposes of de-latching may be similar to the ways described above with respect to DEN pin. However, in some but not all examples, reusing the DSEL pin for de-latching may require the DEN pin to be active (e.g., a digital high on the DEN pin). Also, a rising or falling edge of the voltage on the DSEL pin may cause the switches to de-latch.

For example, if micro-controller 12 determines that switch circuit 14 is to be reset, in this example, micro-controller 12 may activate the DEN pin (i.e., output a digital high to the DEN pin). In addition, micro-controller 12 may output a high voltage if DSEL voltage is low to the DSEL pin or a low voltage if DSEL voltage is high to the DSEL pin. In response, when the DEN pin is active, the switch controller may de-latch the latched switches. Similar to the example of the DEN pin, utilizing the DSEL pin for multiply functions allows resetting switch circuit 14 (e.g., de-latching the switches) without needing an extra reset pin.

In the techniques described in this disclosure, if micro-controller 12 receives a diagnostic signal with an amplitude equal to IOPENLOAD, micro-controller 12 may determine that switch circuit 14 experienced the open load in off condition and did not experience the latched overload condition. In response, micro-controller 12 may output a digital low to the DEN pin (or use the DSEL pin as described above) without needing to determine whether additional safety measures are needed to protect from the overload condition. If micro-controller 12 receives a diagnostic signal with an amplitude equal to IFAULT, micro-controller 12 may determine that switch circuit 14 experienced a latched overload condition, and may maintain the voltage at the DEN pin as a digital high so that switches of switch circuit 14 remain latched and protective measures can be taken to address the overload condition.

Furthermore, with the techniques described in this disclosure, micro-controller 12 may not need to synchronize the voltage output to the DEN pin (e.g., DEN voltage) (or the DSEL pin if the DSEL pin is used for resetting as described above) and the voltage output to IN0/IN1 (e.g., VIN voltage) and the supply voltage to switch circuit 14 (Vs). For example, micro-controller 12 may output a voltage to the DEN pin or DSEL pin, based on the example, irrespective of the input voltage. In other words, the timing of when micro-controller 12 outputs a voltage to the DEN pin or, similarly to the DSEL pin, may not need to be synchronized with the timing of when micro-controller 12 outputs a high VIN voltage or a low VIN voltage (i.e., not synchronized with the PWM cycle of the input voltage).

For instance, micro-controller 12 receives the current from the IS pin of switch circuit 14 and converts the analog signal into a digital signal via an analog-to-digital converter (A-D converter). In examples where the amplitude of IFAULT and IOPENLOAD is the same, micro-controller 12 may need to convert the current received from the IS pin to a digital signal before the VIN voltage becomes high in the PWM signal. Accordingly, in examples where IFAULT equals IOPENLOAD, micro-controller 12 may need to synchronize when to output a voltage to the DEN pin and when to output a voltage to the input pins.

Figure 14A:
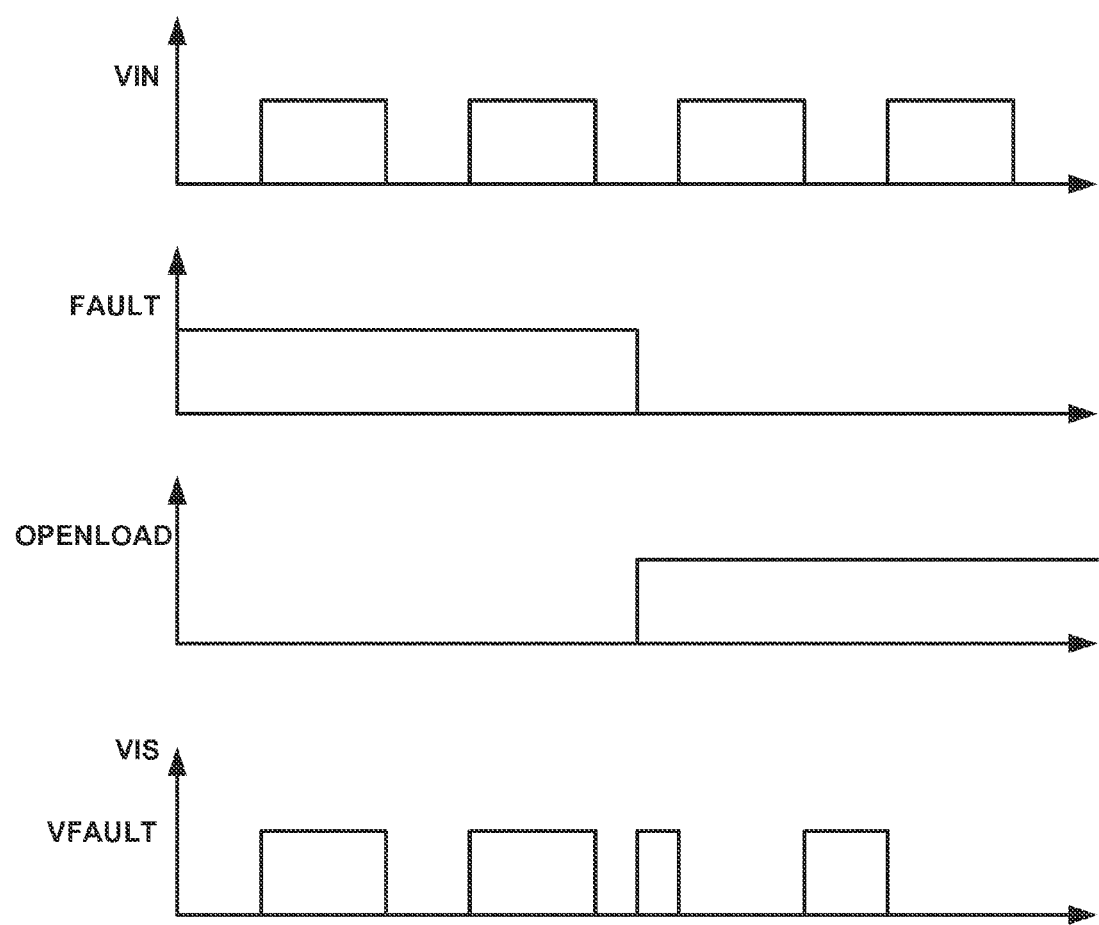
FIGS. 14A and 14B are graphical diagrams illustrating the output of switch circuit 14 in response to an overload condition and an open load in off condition.
Figure 14B:
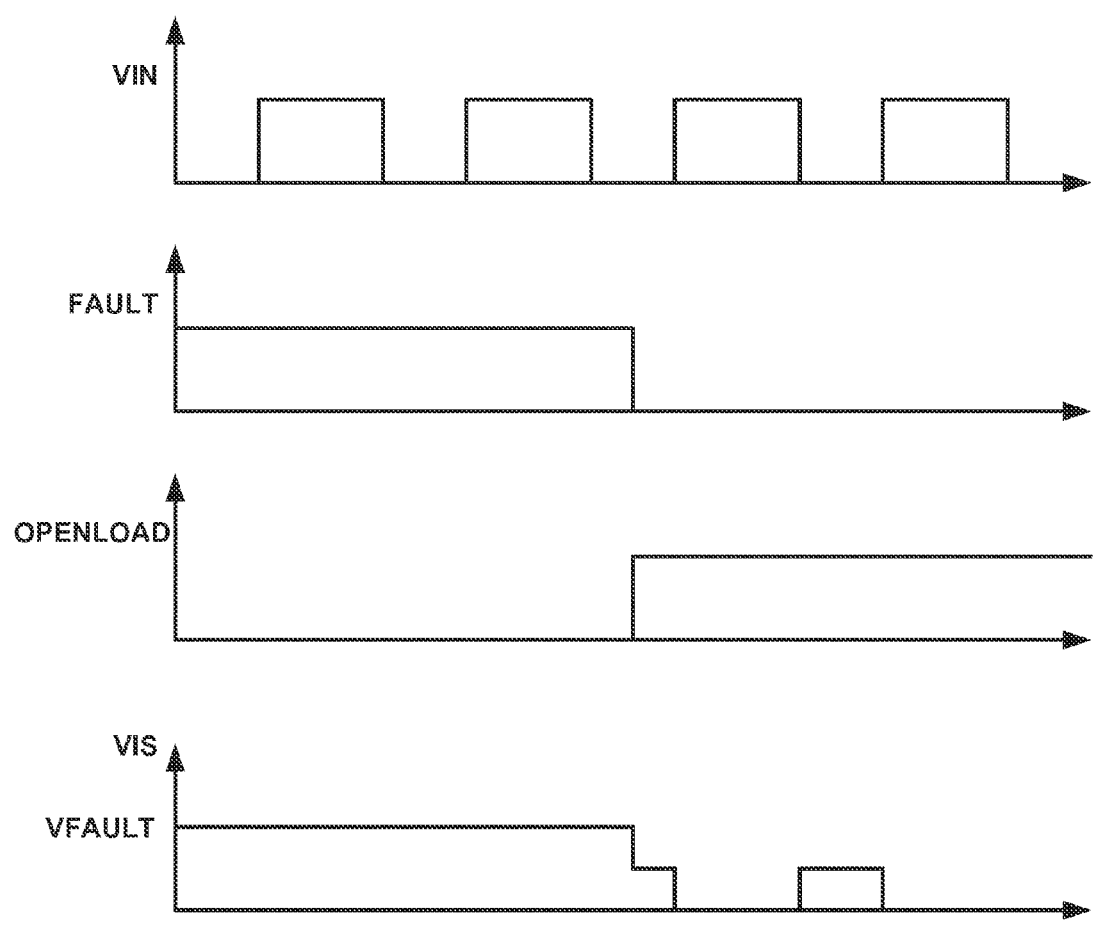

In the techniques described in this disclosure, such synchronization may not be needed. For instance, FIGS. 14A and 14B are graphical diagrams illustrating the output of switch circuit 14 in response to an overload condition and an open load in off condition. In FIGS. 14A and 14B, the input voltage (VIN) is a pulse width modulated (PWM) signal. Also, in FIGS. 14A and 14B, switch circuit 14 initially experiences an overload condition (i.e., fault condition), and when the fault condition no longer exists, switch circuit 14 experiences an open load in off condition.

FIG. 14A illustrates the techniques in accordance with some other examples. As illustrated in FIG. 14A, during the time of the overload condition, switch circuit 14 outputs the VFAULT voltage on the IS pin (i.e., the IFAULT current flowing through a resistor connected to the IS pin). In particular, switch circuit 14 outputs the VFAULT voltage synchronized with the VIN voltage during the overload condition. Then during the open load condition, switch circuit 14 outputs the VFAULT voltage every time the VIN equals zero. Accordingly, in the example illustrated in FIG. 14A, micro-controller 12 may need to determine whether VIN is high or low at the instance that micro-controller 12 received the VFAULT voltage to determine whether switch circuit 14 experienced an overload or an open load in off condition. This requires synchronization between the PWM output of VIN and the reception of VFAULT.

FIG. 14B illustrates the techniques in accordance with this disclosure. Because the IS current indicating the overload and the IS current indicating the open load in off condition are of different amplitudes, switch circuit 14 may constantly output the VFAULT voltage during the overload condition (rather than just during when VIN is high), and may output a voltage that is half VFAULT during the times when VIN is low and switch circuit 14 is experiencing an open load in off condition. For instance, as illustrated in FIG. 14B, during the entire time that switch circuit is experiencing the overload condition, switch circuit 14 may output the VFAULT voltage from the IS pin, rather than just during the times when VIN is high, as illustrated in FIG. 14A (i.e., the VFAULT voltage does not need to be synchronized with the VIN voltage). Then, when switch circuit 14 experiences an open load in off condition, switch circuit 14 may output a voltage that is half the voltage of VFAULT during the times when VIN is low. In this way, only the amplitude of the output from the IS pin may be needed to determine whether switch circuit 14 is experiencing an overload condition or an open load in off condition, without any synchronization.

Figure 6:
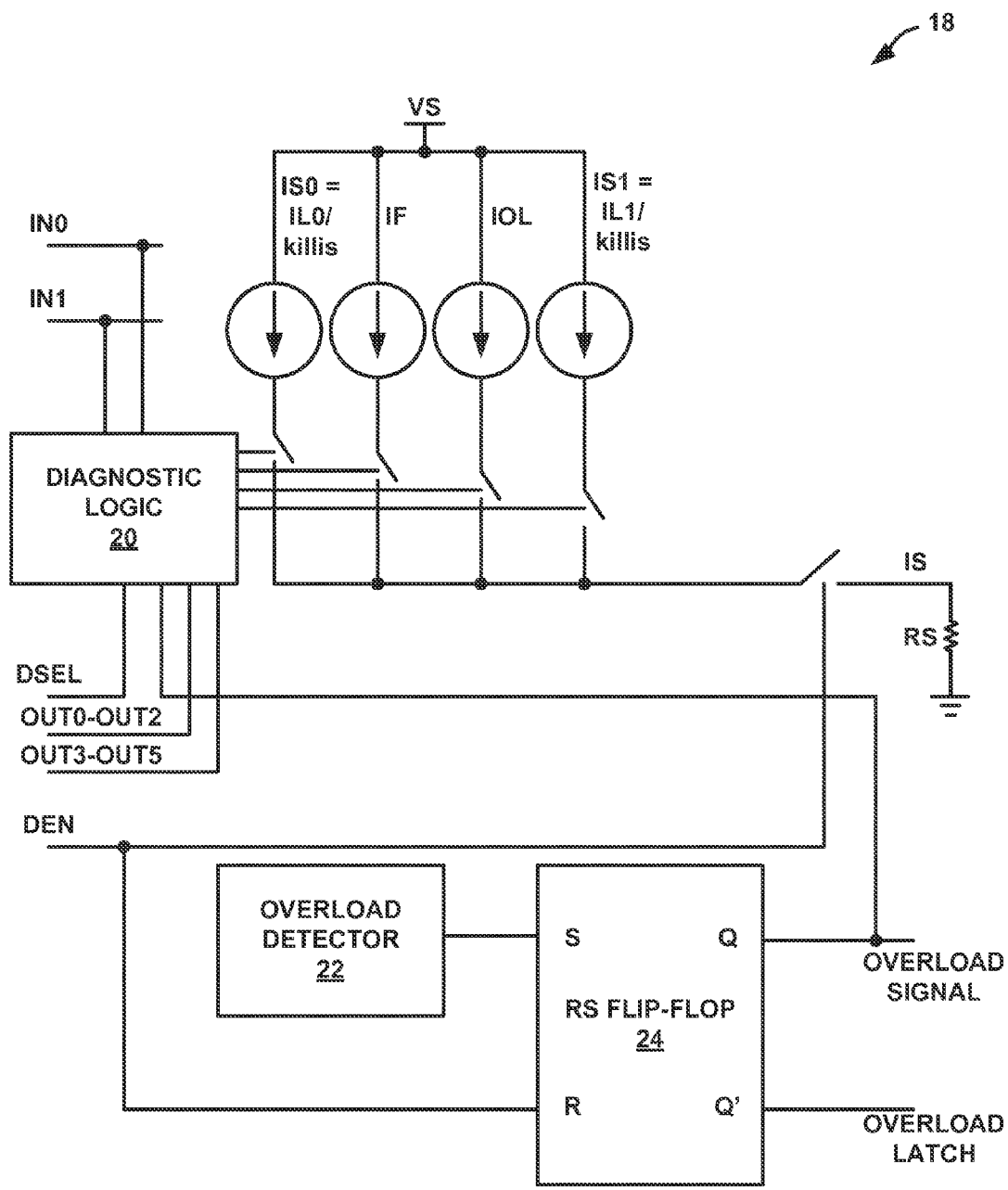
FIG. 6 is a block diagram illustrating an example of the switch circuit of FIG. 1 in greater detail.

FIG. 6 is a block diagram illustrating an example of the switch circuit of FIG. 1 in greater detail. For instance, FIG. 6 illustrates switch controller 18 of switch circuit 14 in greater detail. As illustrated, switch controller 18 includes diagnostic logic 20, overload detector 22, RS flip-flop 24, and four current sources labeled IS0, IF, IOL, and IS1.

In FIG. 6, the IF current refers to the IFAULT current that switch circuit 14 outputs to indicate a latched overload condition. The IOL current refers to the IOPENLOAD current that switch circuit 14 outputs to indicate an open load in off condition. The IS0 current refers to the current level indicative of the amount of current flowing through the loads 16 coupled to one or more of the output pins OUT0-OUT2, and the IS1 current refers to the current level indicative of the amount of current flowing through the loads 16 coupled to one or more of the output pins OUT3-OUT5. For instance, as illustrated, IS0 equals IL0 divided the killis ratio, and IS1 equal IL1 divided by the killis ratio. IL0 is the current flowing through loads 16 coupled to OUT0-OUT2 (i.e., load current of OUT0-OUT2) and IL1 is the current flowing through loads 16 coupled to OUT3-OUT5 (i.e., load current of OUT3-OUT5).

Overload detector 22 may be configured to determine whether a latched overload condition occurred. Examples of the latched overload condition include an overcurrent, an over-temperature, and a fast change in temperature that occurs multiple times within a pulse-width-modulated (PWM) input signal. For instance, overload detector 22 may determine whether current flowing through the switches is greater than a threshold current to determine whether an overcurrent such as a short-circuit occurred. Overload detector 22 may determine whether the temperature within switch circuit 14 became greater than a temperature threshold and may determine whether a change in temperature within switch circuit 14 became faster than a threshold, as examples of the overload condition that occur multiple times during when the input voltage is high in the PWM signal. As another example, overload detector may determine whether the drain-source voltage (i.e., voltage across drain and source or Vds) of a switch is greater than a threshold, as another example of an overload condition that occurs multiple times during when the input voltage is high in the PWM signal. For example, Vds equals Ids (i.e., current through switch) multiplied by resistance. If Vds is above a threshold, it would mean that Ids is greater than a threshold and switch circuit 14 experienced an overload condition. Overload detector 22 may output a digital high when an overload condition is detected to the signal (S) input of RS flip-flop 24.

The Q output of RS flip-flop 24 may indicate whether overload detector 22 detected an overload condition, and RS flip-flop 24 may output an overload signal to diagnostic logic 20. The Q' output of RS flip-flop 24 may output an overload latch signal that causes the switches of switch circuit to latch or de-latch. For instance, as illustrated, the DEN pin of switch circuit 14 is coupled to the reset (R) input of RS flip-flop 24. When the switches are to be latched, Q' may output a signal causing the switches to be latched. Then when the voltage at the DEN pin transitions from a high to a low, RS flip-flop 24 is reset and Q' outputs a signal that causes the switches to de-latch.

In the example illustrated in FIG. 6, transitioning the DEN pin from high to low causes all of the switches of switch circuit 14 to de-latch. However, in some examples, de-latching ail of the switches of switch circuit 14 may not be necessary. Instead, it may be desirable to select which switches are to be de-latched. For the selectable de-latching of the switches, in some examples, switch circuit 14 may include an AND gate, where the inputs to the AND gate are the DSEL pin and the DEN pin. In this example, if the voltage on the DSEL pin is low and the voltage on the DEN pin transitions from a high to a low (e.g., a falling edge), switch circuit 14 may de-latch the switches of the first input/output channel (e.g., IN0/OUT0-OUT2) and not of the second input/output channel (e.g., IN1/OUT3-OUT5), and if the voltage on the DSEL pin is high and the voltage on the DEN pin transitions from a high to a low, switch circuit 14 may de-latch the second input/output channel, and not the first input/output channel.

In this manner, by utilizing an AND gate that receives the DEN pin and DSEL pin voltages as input, it may be possible to select which switches are to be de-latched. The use of the AND gate is not necessary in every example, and is described for purposes of illustration only. In some examples, switch circuit 14 may include the AND gate, but whether the AND gate is utilized or not may be selectable. For instance, if all switches are to be de-latched, the AND gate may not be used, but if the switches are to be selectively de-latched, the AND gate may be used.

As illustrated in FIG. 6, diagnostic logic 20 may receive as inputs the IN0 and IN1 voltages, the DSEL voltage, the OUT0-OUT2 and OUT3-OUT5 voltages (in this example, OUT0-OUT2 are connected together and OUT3-OUT5 are connected together), and the overload signal. Based on these inputs, diagnostic logic 20 may determine which current to output from the IS pin. For example, diagnostic logic 20 may determine whether IN0/OUT0-OUT2 channel is to be diagnosed or the IN1/OUT3-OUT5 channel is to be diagnosed based on the DSEL voltage. If the DSEL voltage is low, diagnostic logic 20 may determine that the IN0/OUT0-OUT2 channel is to be diagnosed and if the DSEL voltage is high, diagnostic logic 20 may determine that the IN1/OUT3-OUT5 channel is to be diagnosed, or vice-versa. For ease of description, the techniques are described with respect to the IN0/OUT0-OUT2 channel; however, the techniques may be the same for the IN1/OUT3-OUT5 channel.

Diagnostic logic 20 may be configured to determine whether switch circuit 14 experienced an open load in off condition. For instance, when input voltage VIN at IN0 is low, diagnostic logic 20 may determine the voltage at OUT0-OUT2. If diagnostic logic 20 determines that the voltage at OUT0-OUT2 is high, diagnostic logic 20 may determine that there is no load 16 connected to one or more of the OUT0-OUT2 pins. In other words, diagnostic logic 20 may be configured to determine whether there is an instance when VIN is low (e.g., zero) and there is no load 16 connected to OUT0-OUT2.

Diagnostic logic 20 may also be configured to determine whether switch circuit 14 experienced a latched overload condition. For instance, diagnostic logic 20 may receive the overload signal, and based on the overload signal, diagnostic logic 20 may determine whether switch circuit 14 experienced the latched overload condition.

Based on whether switch circuit 14 experienced an open load in off condition, a latched overload condition, or neither the open load in off condition nor the latched overload condition, diagnostic logic 20 may allow the current from one of IS0, IF, IOL, and IS1 to output from the IS pin. For example, as illustrated in FIG. 6, when the DEN voltage is high, the IS pin outputs one IS0, IF, IOL, and IS1 currents through the resistor RS and to GND. In FIG. 6, diagnostic logic 20 determines whether IS0, IF, IOL, or IS1 flows out of the IS pin when DEN voltage is high.

For example, assume that DSEL is low (selecting the IN0/OUT0-OUT2 channel) and diagnostic logic 20 determined that the IN0/OUT0-OUT2 channel did not experience either a latched overload condition or an open load in off condition. In this example, when the DEN voltage is high, diagnostic logic 20 may cause the IS pin to output the IS0 current which indicates the amount of current flowing to one or more of loads 16 coupled to OUT0-OUT2. As another example, assume that DSEL is high (selecting the IN1/OUT3-OUT5 channel) and diagnostic logic 20 determined that the IN1/OUT3-OUT5 channel did not experience either a latched overload condition or an open load in off condition. In this example, when the DEN voltage is high, diagnostic logic 20 may cause the IS pin to output the IS1 current which indicates the amount of current flowing to one or more of loads 16 coupled to OUT3-OUT5.

In some examples, assume that DSEL is low and diagnostic logic 20 determined that the IN0/OUT0-OUT2 channel experienced a latched overload condition based on the overload signal from RS flip-flop 24. In these examples, diagnostic logic 20 may cause the IS pin to output the IF current (i.e., the IFAULT current) indicating that switch circuit 14 experienced the latched overload condition on the IN0/OUT0-OUT2 channel. The same would occur if DSEL is high and diagnostic logic 20 determined that the IN1/OUT3-OUT5 channel experienced a latched overload condition.

In some examples, assume that DSEL is low and diagnostic logic 20 determined that the IN0/OUT0-OUT2 channel experienced an open load in off condition based on the voltage at OUT0-OUT2 being high when IN0 was low. In these examples, when IN0 is low, diagnostic logic 20 may cause the IS pin to output the IOL current (i.e., the IOPEN-LOAD current) indicating that switch circuit 14 experienced the open load in off condition on the IN0/OUT0-OUT2 channel. The same would occur if DSEL is high and diagnostic logic 20 determined that the IN1/OUT3-OUT5 channel experienced an open load in off condition.

In the example illustrated in FIG. 6, the IF current represents a first diagnostic signal indicating the occurrence of a latched overload condition, and the IOL current represents a second, different diagnostic signal indicating the occurrence of an open load in off condition. In the example illustrated in FIG. 6, the amplitude of the IF current and the amplitude of the IOL current may be different. As one example, the amplitude of the IOL current may be half the amplitude of the IF current (i.e., IOL=IF/2).

In this manner, FIG. 6 illustrates an example of switch controller 18 that allows for switch circuit 14 to output a first diagnostic signal indicative of a latched overload condition and a second, different diagnostic signal indicative of an open load in off condition. Also, with switch controller 18, as illustrated in FIG. 6, the DEN pin may provide multiple functions. For instance, the voltage on the DEN pin may indicate whether to de-latch switches latched due to a latched overload condition, and the voltage on the DEN pin may enable or disable the diagnostic functionality of switch circuit 14. For instance, when the DEN voltage is low, there may be no current that is output on the IS pin meaning no diagnostic information is provided to micro-controller 12.

In other words, if the voltage at the DEN pin is high, switch controller 18 may enable the output of diagnostic information to micro-controller 12. If the voltage at the DEN pin is low, switch controller 18 may disable the output of diagnostic information to micro-controller. Furthermore, if the voltage at the DEN pin is high, switch controller 18 may de-latch switches that were latched due to the latched overload condition allowing the DEN pin to be used for the reset functionality, in addition to being used for the enabling or disabling of the output of diagnostic information.

In the examples described above, the condition of open load in off condition referred to loads 16 being disconnected or there being no load connected to the output pins otherwise. However, in some examples, the output pins may be coupled to a capacitor to ground in addition to being coupled to one or more loads 16. In this case, the open load in off condition may mean that there is still a capacitor on the output pins. In other words, the techniques described in this disclosure may be applicable to the open load in off detection in case of a capacitive load.

Figure 7A:
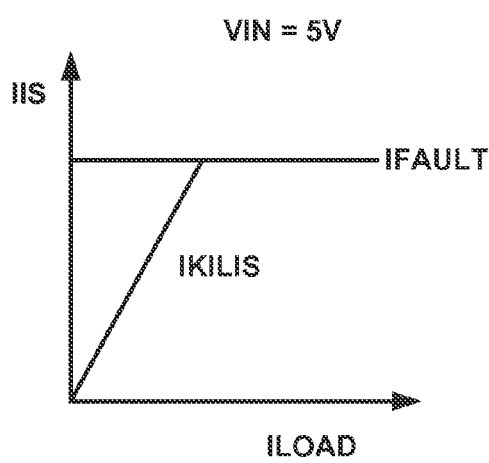
FIGS. 7A and 7B are graphical diagrams illustrating additional examples of diagnostic signals in response to a latched overload condition and an open load in off condition.
Figure 7B:
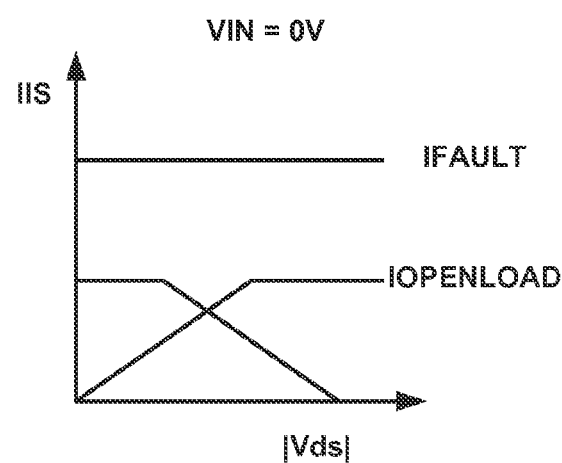

FIGS. 7A and 7B are graphical diagrams illustrating additional examples of diagnostic signals in response to a latched overload condition and an open load in off condition. For example, FIG. 7A illustrates the example of VIN equaling a digital high (e.g., 5V), and the diagnostic signal indicating the latched overload condition (i.e., IFAULT). As illustrated, FIG. 7A is substantially similar to FIG. 5A.

FIG. 7B illustrates the example of VIN equaling a digital low (e.g., 0V), and the diagnostic signal indicating the open load in off condition. However, in example FIG. 7B, there is a capacitive load on the output pins. Because of the capacitive load on the output pins, the drain-source voltage (Vds) of the power transistor that forms the switch connected to the output may be complex (e.g., include a real component and an imaginary component). Accordingly, the x-axis of FIG. 7B is illustrated as being the modulus of Vds. In this case, the IS current (IIS) is equal to a current IVOUT proportional to a voltage at the output pin of switch circuit 14. For example, because of the capacitive load on the output pin, there is a rise time in the output voltage (VOUT) based on the capacitive load and a pull up resistor described in more detail below. The IS current tracks this rise time, as illustrated by the sloped line portion of IOPENLOAD, and settles at the IOPENLOAD level after the rise time. The IVOUT current may be smaller than the IOPENLOAD current, which is why the sloped portion illustrated in FIG. 7B may be considered as the IVOUT current. In other words, in some examples, when switch controller 18 outputs the diagnostic signal indicative of an open load in off condition, switch controller 18 may output the diagnostic signal that is proportional to an output voltage during a rise time of the output voltage. Also, in this example, the |Vds| voltage may slowly decay.

Figure 8:
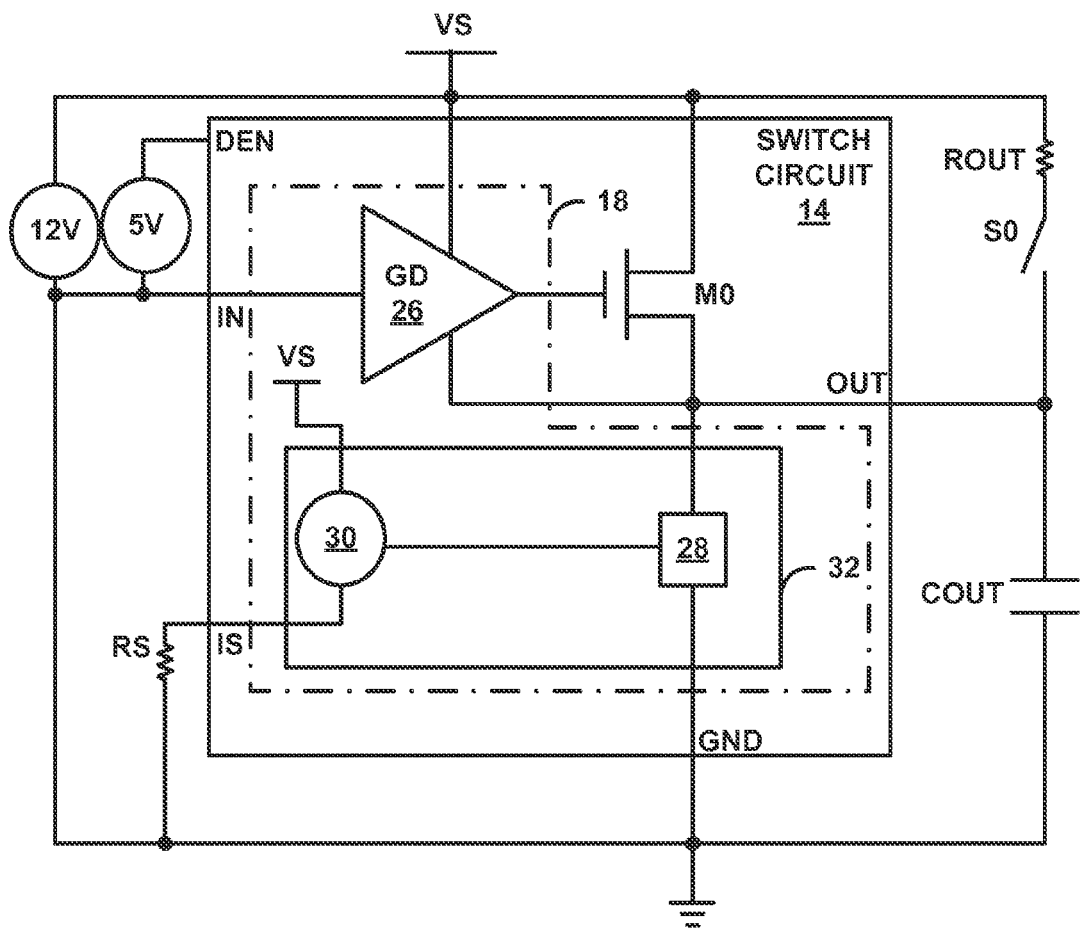
FIG. 8 is a block diagram illustrating an example of an open load in off condition with a capacitive load.

FIG. 8 is a block diagram illustrating an example of an open load in off condition with a capacitive load. As illustrated, the VS voltage is coupled to 12V, the DEN pin is coupled to 5V, the input pin (e.g., IN0 or IN1) illustrated as IN in FIG. 8 is coupled to ground (i.e., VIN equals zero), and the output pin illustrated as OUT in FIG. 8 is not coupled to a load 16, but is coupled to a capacitive load COUT. Because VIN is zero and the OUT pin is not connected to a load 16, switch circuit 14 is in the open load in off condition. Also, because the voltage at the DEN pin is 5V (e.g., a digital high), diagnostic capabilities are enabled and switch controller 18 is configured to output a current via the IS pin indicative of the open load in off condition.

FIG. 8 illustrates additional components of switch controller 18 relative to the example of switch controller 18 illustrated in FIG. 6. As illustrated, switch controller 18, in FIG. 8, includes gate driver (GD) 26 that receives the input voltage and causes transistor M0 to turn on or off. Transistor M0 is one example of a switch in switch circuit 14.

When VIN equals zero, switch controller 18 causes switch S0 to close allowing current to flow from VS through resistor ROUT and capacitor COUT. The time at which switch controller 18 causes switch S0 to close is referred to as $t_{DL\_DIAG}$. However, because voltage across capacitor COUT cannot change instantaneously, the voltage at the OUT pin (VOUT) rises slowly from zero volts to VS based on a time constant defined by ROUT and COUT. In other words, at time $t_{DL\_DIAG}$, switch S0 closes and there is a certain rise time before VOUT equals VS.

As illustrated in FIG. 8, switch controller 18 includes voltage controlled current source (VCCS) 32. VCCS 32 is one example of the current source IOL described in FIG. 6. In other words, VCCS 32 outputs the current with amplitude IOL to indicate that switch circuit 14 experienced the open load in off condition.

VCCS 32 includes current controller 28 and current source 30. Current controller 28 may determine the voltage at the OUT pin (VOUT), and cause current source 30 to output a current proportional to VOUT. As illustrated in FIG. 8, the output of current source 30 is the current that switch circuit 14 outputs via the IS pin. For example, the current output by the IS pin flows through the RS resistor causing a voltage VIS across the RS resistor.

As described above, the current that current source 30 outputs is proportional to the VOUT voltage. Accordingly, as the voltage at VOUT rises based on the rise time defined by ROUT and COUT, the amplitude of the current output by current source 30 (i.e., the IS current) rises proportionally. When the VOUT voltage rises to VS, the amplitude of the current output of current source 30 equals IOPENLOAD. In this manner, the IS current in response to an open load in off condition tracks the IOPENLOAD current illustrated in FIG. 7B (i.e., starts low and rises to the IOPENLOAD amplitude).

Figure 9:
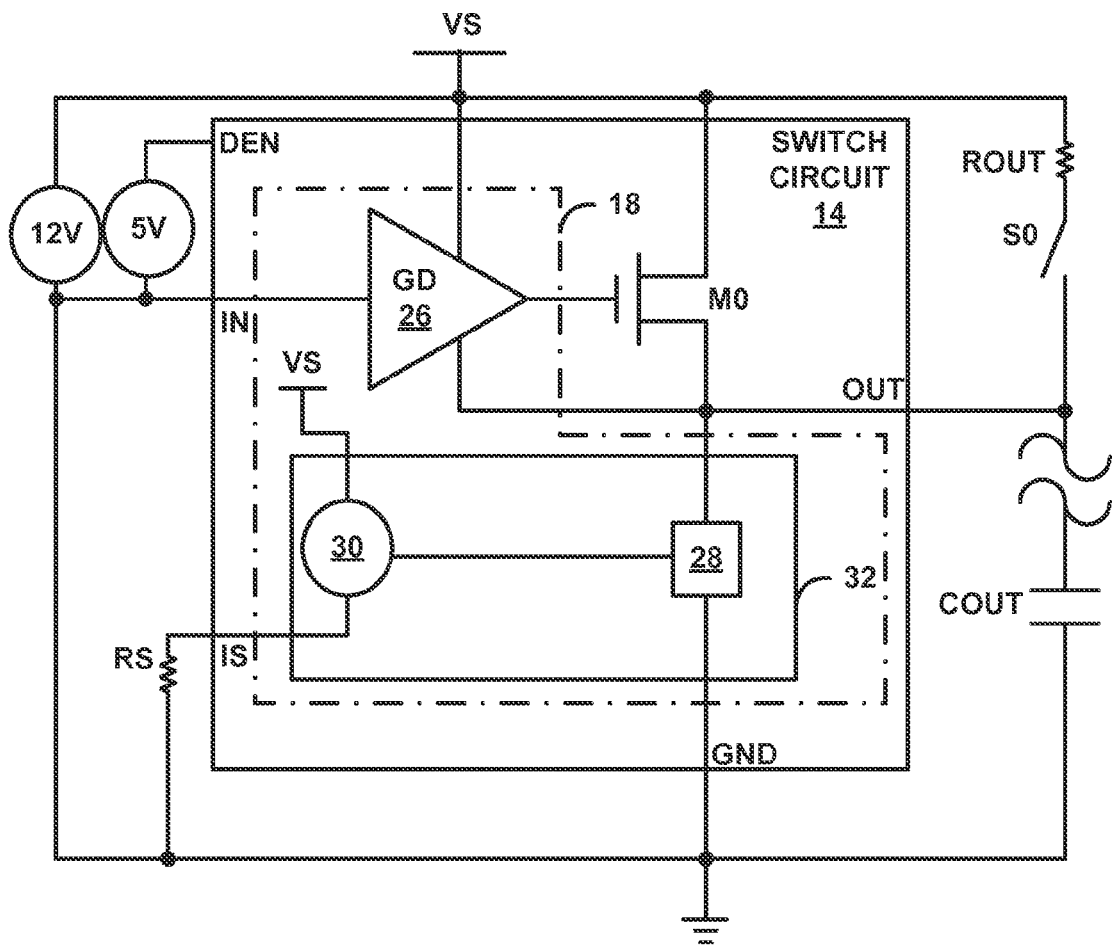
FIG. 9 is a block diagram illustrating an example of an open load in off condition without a capacitive load.

FIG. 9 is a block diagram illustrating an example of an open load in off condition without a capacitive load. FIG. 9 is substantially similar to FIG. 8, except that capacitor COUT is not coupled to the OUT pin. Accordingly, in the example illustrated in FIG. 9, at time $t_{DL\_DIAG}$, when switch controller 18 closes switch S0, the VOUT voltage jumps virtually instantaneously to VS, This causes the current output by current source 30 to also jump virtually instantaneously to IOPENLOAD. In the example of FIG. 9, the current output by the IS pin appears identical to the IOPENLOAD current illustrated in FIG. 5C.

Figure 10A:
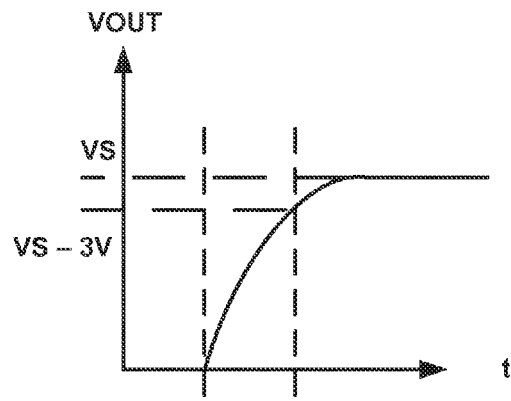
FIGS. 10A and 10B are graphical diagrams illustrating examples of the output voltage and diagnostic signal in an open load in off condition with capacitive load.
Figure 10B:
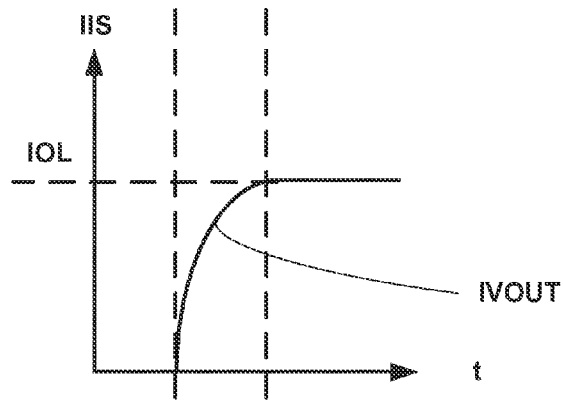

FIGS. 10A and 10B are graphical diagrams illustrating examples of the output voltage and diagnostic signal in an open load in off condition with capacitive load. For example, at time $t_{DL\_DIAG}$, switch controller 18 closes switch S0, which in turn causes the VOUT voltage to rise as illustrated in FIG. 10A. As illustrated in FIG. 10B, the IS current (IIS) also starts to rise because voltage controlled current source (VCCS) 32 outputs a current proportional to VOUT. In FIGS. 10A and 10B, the IS current is proportional to VOUT (as illustrated by IOUT in FIG. 10B) as long as VOUT is less than VS-3V. After VOUT is greater than or equal to VS-3V (i.e., VOUT is greater than or equal to VS-3V and less than or equal to VS). Then, the IS current equals IOL, which as described above refers to the IOVERLOAD amplitude. As described above, the steepness of the slope in FIGS. 10A and 10B is based on ROUT and COUT.

Figure 11A:
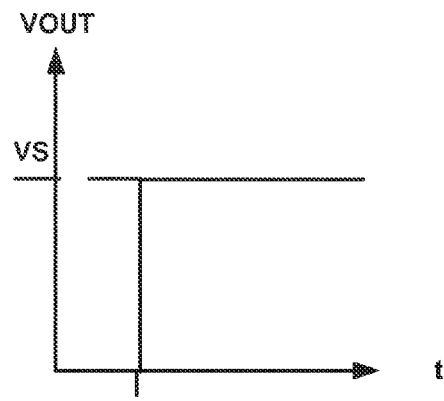
FIGS. 11A and 11B are graphical diagrams illustrating examples of the output voltage and diagnostic signal in an open load in off condition without capacitive load.
Figure 11B:
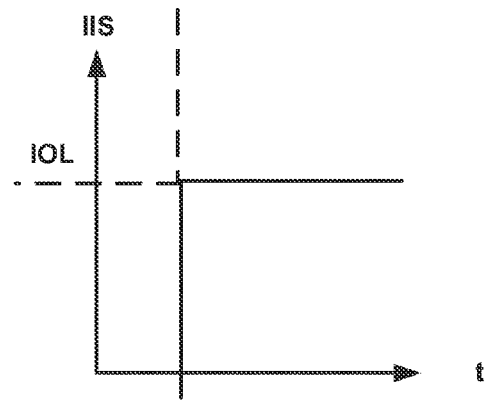

FIGS. 11A and 11B are graphical diagrams illustrating examples of the output voltage and diagnostic signal in an open load in off condition with capacitive load. In FIGS. 11A and 11B, because there is no capacitive load (i.e., no COUT), there is not rise time for the VOUT voltage and hence, no rise time for the IIS current. For instance, as illustrated in FIGS. 11A and 11B, at time $t_{DL\_DIAG}$, the amplitude of the VOUT voltage rises from zero to approximately VS virtually instantaneously. Because the amplitude of the IIS current is proportional to the VOUT voltage, the amplitude of the IIS current also rises to the IOL amplitude (i.e., IOPENLOAD amplitude) virtually instantaneously.

Figure 12:
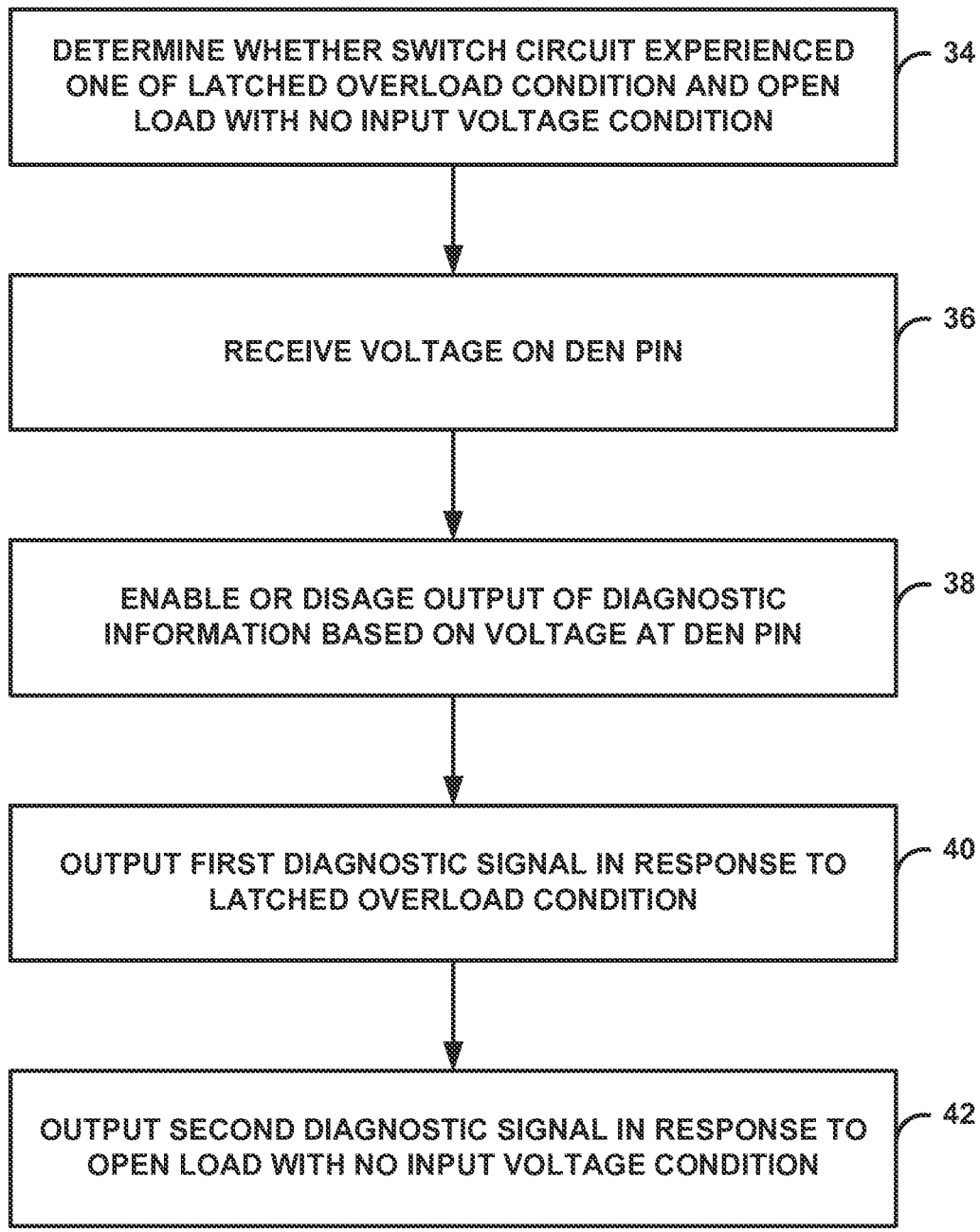
FIG. 12 is a flowchart illustrating an example technique in accordance with this disclosure.

FIG. 12 is a flowchart illustrating an example technique in accordance with this disclosure. For example, switch controller 18 may determine whether switch circuit 14 experienced one of a latched overload condition and an open load with no input voltage condition (e.g., open load in off condition) (34). Examples of the latched overload condition include an overcurrent (current above a threshold), an over-temperature (temperature above a threshold), and a fast change in temperature that occurs multiple times (e.g., four times) within a pulse-width-modulated (PWM) input signal, as illustrated in FIGS. 2A, 2B, 3A, 3B, 4A, and 4B. Examples of the open load with no input voltage include an instance when the input voltage is low (e.g., zero) and there is no load 16 connected to an output of switch circuit 14. For instance, FIGS. 8 and 9 illustrate examples of the open load with no input voltage where there is no input voltage and there is no load 16 connected to the output of switch circuit 14.

Switch circuit 14 may receive a voltage at the diagnostic enable (DEN) pin of switch circuit 14 from micro-controller 12 (36). In some examples, switch circuit 14 may receive the voltage at the DEN pin irrespective of a time when switch circuit 14 received a high voltage or a low voltage of the PWM signal at the input pin of switch circuit 14. Switch controller 18 may enable or disable output of diagnostic information based on the voltage at the DEN pin (38). For example, if the voltage at the DEN pin is high, switch controller 18 may enable the output of diagnostic information (e.g., a diagnostic signal), and if the voltage at the DEN pin is low, switch controller 18 may disable the output of diagnostic information.

In some examples, when the DEN voltage transitions from a high to a low, switch controller 18 may de-latch the latched switches. In some examples, when the DEN voltage is high, switch controller 18 may de-latch the latched switches if a voltage on the DSEL pin transitions from high to low or low to high. In this way, the techniques may utilize a pin of switch circuit 14 for the additional purpose of resetting switch circuit 14.

Switch controller 18 may output a first diagnostic signal, via the diagnostic output pin (IS pin) to micro-controller 12, in response to determining that switch circuit 14 experienced the latched overload condition (40). Switch controller 18 may output a second, different-diagnostic signal, via the diagnostic output pin (IS pin) to micro-controller 12, in response to determining that switch circuit 14 experienced the open load with no input voltage condition (42).

As one example, switch controller 18 may output a current with a first amplitude to output the first diagnostic signal, and may output a current with a second, different amplitude to output the second diagnostic signal when there is no input voltage. For instance, in some examples, when VIN is zero and switch circuit 14 experienced an open load in off condition, switch controller 18 may output the second diagnostic signal. In some examples, the first amplitude may be twice the second amplitude. Also, outputting the second, different diagnostic signal may include outputting the second, different diagnostic signal that is proportional to an output voltage during a rise time of the output voltage (as illustrated in FIG. 7B), In other words, to output the second, different diagnostic signal, switch controller 18 may be configured to output the second, different diagnostic signal that is proportional to an output voltage during a rise time of the output voltage.

In some examples, to output the second diagnostic signal, switch controller 18 may output a current via the diagnostic output pin whose amplitude is proportional to an output voltage of switch circuit 14 for at least a part of a rise time of the output voltage. For example, the second diagnostic signal indicates the open load with no input voltage condition. In some examples, although a load 16 may be disconnected, a capacitive load (e.g., capacitor COUT) may still be connected to an output pin of switch circuit 14. In these examples, as illustrated in FIGS. 10A and 10B, the amplitude of the current from the diagnostic output pin is proportional to an output voltage (VOUT) of switch circuit 14 for at least a part of the rise time of the output voltage. For instance, for the part of the rise time from when the VOUT voltage rises from zero to VS-3V, the amplitude of the current output from the diagnostic output pin (i.e., the IIS current illustrated in FIG. 10B) is proportional to the output voltage.

Figure 13:
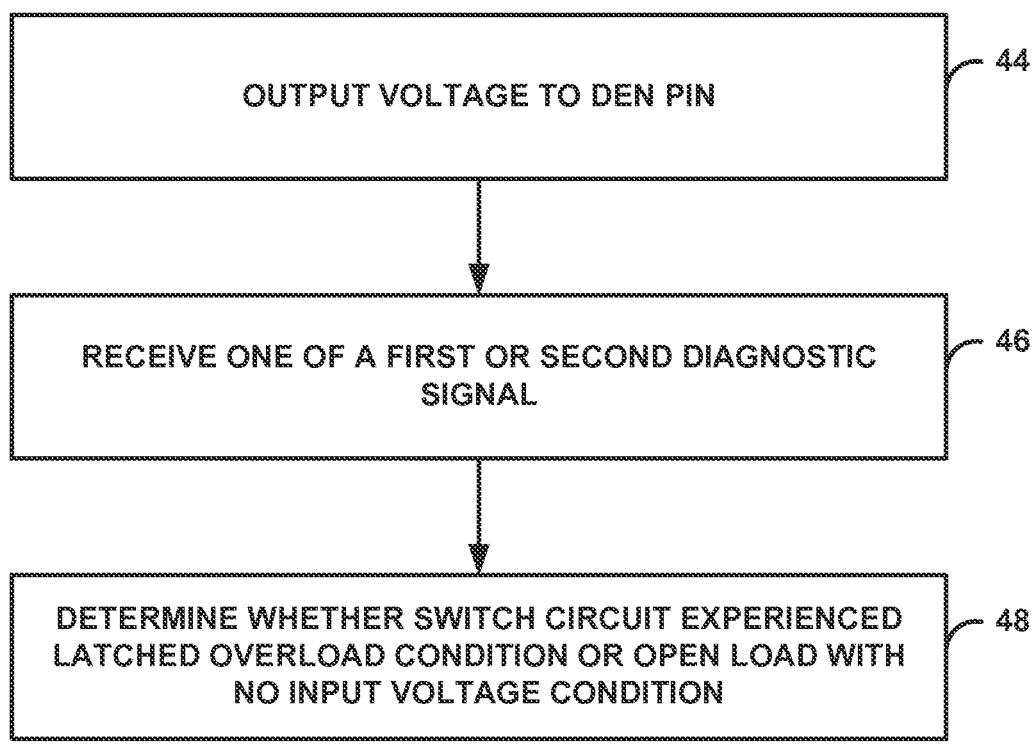
FIG. 13 is another flowchart illustrating an example technique in accordance with this disclosure.

FIG. 13 is another flowchart illustrating an example technique in accordance with this disclosure. As illustrated, micro-controller 12 may output a voltage to the DEN pin of switch circuit 14 (44). For example, micro-controller 12 may enable or disable output of diagnostic information from switch circuit 14 by outputting voltage to the DEN pin of switch circuit 14. Also, micro-controller 12 may cause the de-latching of switches of switch circuit 14 by outputting voltage to the DEN pin (or DSEL pin, as described above) of switch circuit 14 when the switches of switch circuit 14 are latched due to the latched overload condition.

Furthermore, micro-controller 12 may be configured to output a pulse-width-modulated (PWM) signal as the input voltage to switch circuit 14. In some examples, micro-controller 12 may output the voltage to the DEN pin of switch circuit 14 for enabling or disabling output of diagnostic information and de-latching latched switches due to the latched overload condition irrespective of a time when micro-controller 12 outputted a high voltage or a low voltage of the PWM input voltage signal. Similarly, in examples where the DSEL pin is used to de-latch, microcontroller 12 may output the voltage to the DSEL pin for de-latching irrespective of a time when micro-controller 12 outputted a high voltage or a low voltage of the PWM input voltage signal.

Micro-controller 12 may receive one of a first or second diagnostic signal from switch circuit 14 in response to micro-controller 12 outputting a high voltage on the DEN pin if switch circuit 14 experienced a latched overload condition or an open load with no input voltage condition (46). Micro-controller 12 may determine whether switch circuit 14 experienced the latched overload condition or the open load with no input voltage condition based on whether micro-controller 12 received the first diagnostic signal or the second, different diagnostic signal (48). For example, if micro-controller 12 receives a current with a first amplitude as the first diagnostic signal, micro-controller 12 may determine that switch circuit 14 experienced the latched overload condition. If micro-controller 12 receives a current with a second, different amplitude as the second diagnostic signal, micro-controller 12 may determine that switch circuit 14 experienced the open load with no input voltage condition.

The techniques of this disclosure may be implemented in a wide variety of devices or apparatuses, with an integrated circuit (IC) or a set of ICs (i.e., a chip set). Various components, modules, or units are described in this disclosure to emphasize functional aspects of devices configured to perform the disclosed techniques, but do not necessarily require realization by different hardware units. Rather, various units may be combined in a hardware unit or provided by a collection of interoperative hardware units.

Various examples have been described. These and other examples are within the scope of the following claims.

The invention claimed is:

1. A method comprising:
  receiving, from a microcontroller, at an input pin of a switch circuit an input voltage or current that causes the switch circuit to cause current to flow through one or more output pins of the switch circuit;
  determining whether the switch circuit experienced one of a latched overload condition and an open load with no input voltage condition;
  in response to determining that the switch circuit experienced the latched overload condition, outputting a first diagnostic signal indicating that the switch circuit experienced the latched overload condition; and
  in response to determining that the switch circuit experienced the open load with no input voltage condition, outputting a second, different diagnostic signal indicating that the switch circuit experienced the open load with no input voltage condition,
  wherein the method further comprises one of:
    receiving a voltage on a diagnostic enable (DEN) pin of the switch circuit, wherein the DEN pin is different than the input pin on which the switch circuit receives the input voltage or current that caused the switch circuit to cause the current to flow through the one or more output pins of the switch circuit;
    enabling or disabling output of diagnostic information based on the received voltage at the DEN pin; and
    de-latching switches of the switch circuit based on the received voltage at the DEN pin when the switches of the switch circuit are latched due to the latched overload condition, wherein the switches of the switch circuit are coupled to respective load driving outputs of the switch circuit, and wherein the DEN pin is the same pin used to enable or disable output of diagnostic information; or
    receiving a digital high voltage on the DEN pin of the switch circuit, wherein the DEN pin is different than the input pin on which the switch circuit receives input voltage or current that caused the switch circuit to cause the current to flow through the one or more output pins of the switch circuit;
    receiving a voltage transition from a digital high to a digital low or a digital low to a digital high on a diagnostic select (DSEL) pin of the switch circuit when the voltage on the DEN pin is the digital high; and
    de-latching switches of the switch circuit based on the received voltage transition at the DSEL pin when the switches of the switch circuit are latched due to the latched overload condition if the voltage on the DEN pin is the digital high, wherein the switches of the switch circuit are coupled to respective load driving outputs of the switch circuit, and wherein the DEN pin is the same pin used to enable or disable output of diagnostic information
    wherein voltage at the DSEL pin is used to select an input/output channel whose diagnostic information is to be outputted.

2. The method of claim 1, wherein outputting a first diagnostic signal comprises outputting a current with a first amplitude, and wherein outputting the second, different diagnostic signal comprises outputting a current with a second, different amplitude when there is no input voltage.

3. The method of claim 2, wherein the first amplitude is twice the second amplitude.

4. The method of claim 1, wherein outputting the second, different diagnostic signal comprises outputting the second, different diagnostic signal that is proportional to an output voltage during a rise time of the output voltage.

5. The method of claim 1, further comprising:
  receiving the input voltage as a pulse-width-modulated (PWM) signal; and
  receiving a voltage at the DEN pin of the switch circuit for enabling or disabling output of diagnostic information and de-latching latched switches due to the latched overload condition irrespective of a time of receiving a high voltage or a low voltage of the PWM input voltage signal.

6. The method of claim 1, wherein the latched overload condition comprises one of a overcurrent, an over-temperature, a fast change in temperature, and a drain-source voltage of a switch being greater than a threshold that occurs multiple times within a pulse-width-modulated (PWM) input signal, and wherein the open load with no input voltage condition comprises an instance when the input voltage is low and there is no load connected to an output of the switch circuit.

7. A switch circuit comprising:
  one or more switches coupled to respective load driving outputs of the switch circuit;
  one or more input pins configured to receive, from a microcontroller, input voltage or current that causes the switch circuit to cause current to flow through the outputs of the switch circuit;
  a diagnostic enable (DEN) pin that is different than the one or more input pins;
  a diagnostic select (DSEL) pin;
  a diagnostic output pin; and
  a switch controller configured to:
    determine whether the switch circuit experienced one of a latched overload condition and an open load with no input voltage condition;

in response to determining that the switch circuit experienced the latched overload condition, output, via the diagnostic output pin, a first diagnostic signal indicating that the switch circuit experienced the latched overload condition; and in response to determining that the switch circuit experienced the open load with no input voltage condition, output, via the diagnostic output pin, a second, different diagnostic signal indicating that the switch circuit experienced the open load with no input voltage condition, wherein the switch controller is configured to one of:
enable or disable output of diagnostic information based on voltage received at the DEN pin, and
de-latch the one or more switches based on voltage received at the DEN pin when the one or more switches of the switch circuit are latched due to the latched overload condition, wherein the DEN pin is different than the one or more input pins that receive the input voltage or current that caused the switch circuit to cause the current to flow through the outputs of the switch circuit; or
select an input/output channel whose diagnostic information is to be outputted based on a voltage at the DSEL pin, and
de-latch the one or more switches based on a voltage transition received at the DSEL pin when the one or more switches of the switch circuit are latched due to the latched overload condition if a voltage on the DEN pin is a digital high wherein the DEN pin is different than the one or more input pins that receive the input voltage or current that caused the switch circuit to cause the current to flow through the outputs of the switch circuit.

8. The switch circuit of claim 7, wherein the switch controller is configured to output a current with a first amplitude to output the first diagnostic signal, and output a current with a second, different amplitude to output the second diagnostic signal.

9. The switch circuit of claim 8, wherein the first amplitude is twice the second amplitude.

10. The switch circuit of claim 7, wherein, to output the second, different diagnostic signal, the switch controller is configured to output the second, different diagnostic signal that is proportional to an output voltage during a rise time of the output voltage.

11. The switch circuit of claim 7, further comprising:
an input pin configured to receive the input voltage as a pulse-width-modulated (PWM) signal,
wherein the DEN pin is configured to receive a voltage for enabling or disabling output of diagnostic information and de-latching latched switches due to the latched overload condition irrespective of a time when the input pin received a high voltage or a low voltage of the PWM input voltage signal.

12. The switch circuit of claim 7, wherein the latched overload condition comprises one of a overcurrent, an over-temperature, a fast change in temperature, and a drain-source voltage of a switch being greater than a threshold that occurs multiple times within a pulse-width-modulated (PWM) input signal, and wherein the open load with no input voltage condition comprises an instance when the input voltage is low and there is no load connected to an output of the switch circuit.

13. A system comprising:
a micro-controller configured to:
output an input voltage or current to an input pin of a switch circuit, wherein the input voltage or current to the input pin causes the switch circuit to cause current to flow through one or more output pins of the switch circuit;
determine whether the switch circuit experienced a latched overload condition or an open load with no input voltage condition based on whether the micro-controller received a first diagnostic signal from the switch circuit or a second, different diagnostic signal from the switch circuit;
enable or disable output of diagnostic information from the switch circuit by outputting voltage to a diagnostic enable (DEN) pin of the switch circuit, wherein the DEN pin is different than the input pin to which the microcontroller outputs the input voltage or current; and
cause de-latching of switches of the switch circuit by outputting voltage to one of the DEN pin of the switch circuit and a diagnostic select (DSEL) pin of the switch circuit when the switches of the switch circuit are latched due to the latched overload condition, wherein the switches of the switch circuit are coupled to respective load driving outputs of the switch circuit.

14. The system of claim 13, wherein the micro-controller is configured to determine that the switch circuit experienced the latched overload condition when the micro-controller receives the first diagnostic signal comprising a current with a first amplitude, and wherein the micro-controller is configured to determine that the switch circuit experienced the open load with no input voltage condition when the micro-controller receives the second diagnostic signal comprising a current with a second, different amplitude.

15. The system of claim 13, wherein the micro-controller is configured to output a pulse-width-modulated (PWM) signal as the input voltage to the switch circuit, and wherein the micro-controller is configured to output a voltage to the DEN pin of the switch circuit for enabling or disabling output of diagnostic information and de-latching latched switches due to the latched overload condition irrespective of a time when the micro-controller outputted a high voltage or a low voltage of the PWM input voltage signal.

\* \* \* \* \*